US010374607B2

(12) United States Patent
Yagishita

(10) Patent No.: US 10,374,607 B2
(45) Date of Patent: Aug. 6, 2019

(54) VOLTAGE CONVERSION CIRCUIT AND ELECTRONIC DEVICE

(71) Applicant: SONY CORPORATION, Tokyo (JP)

(72) Inventor: Yuki Yagishita, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/769,465

(22) PCT Filed: Jul. 27, 2016

(86) PCT No.: PCT/JP2016/071978
§ 371 (c)(1),
(2) Date: Apr. 19, 2018

(87) PCT Pub. No.: WO2017/081890
PCT Pub. Date: May 18, 2017

(65) Prior Publication Data
US 2018/0309450 A1    Oct. 25, 2018

(30) Foreign Application Priority Data

Nov. 10, 2015    (JP) ................................. 2015-220039

(51) Int. Cl.
*H03K 19/0175*    (2006.01)
*H03K 19/0185*    (2006.01)
(Continued)

(52) U.S. Cl.
CPC ............... *H03K 19/018571* (2013.01); *H03K 17/04123* (2013.01); *H03K 17/302* (2013.01);
(Continued)

(58) Field of Classification Search
CPC ......... H03K 17/302; H03K 19/018507; H03K 19/018571; H03M 1/38
See application file for complete search history.

(56) References Cited

U.S. PATENT DOCUMENTS 6,980,194 B2*  12/2005  Tobita .............. H03K 3/356113
                                                      326/63
8,649,477 B2*   2/2014  Matsui ................. G11C 19/184
                                                      377/64
(Continued)

FOREIGN PATENT DOCUMENTS

JP    63-20916  A    1/1988
JP    63-020916 A    1/1988
(Continued)

OTHER PUBLICATIONS

International Search Report and Written Opinion of PCT Application No. PCT/JP2016/071978, dated Oct. 18, 2016, 07 pages of ISRWO.

*Primary Examiner* — Alexander H Taningco
*Assistant Examiner* — Kurtis R Bahr
(74) *Attorney, Agent, or Firm* — Chip Law Group

(57) ABSTRACT

An operation speed of a voltage conversion circuit is improved without increasing an output level of the voltage conversion circuit. The voltage conversion circuit is provided with a high-voltage side transistor and a gate control unit. In this voltage conversion circuit, the high-voltage side transistor outputs a predetermined high voltage higher than a predetermined reference voltage. Also, in the voltage conversion circuit, the gate control unit generates a predetermined control voltage higher than a predetermined high voltage from an input signal and applies the same between a gate and a source of the high-voltage side transistor, thereby allowing the high-voltage side transistor to output a predetermined high voltage.

9 Claims, 18 Drawing Sheets

(51) Int. Cl.
    *H03M 1/38*          (2006.01)
    *H03M 1/74*          (2006.01)
    *H03K 17/30*         (2006.01)
    *H03K 17/0412*      (2006.01)

(52) U.S. Cl.
    CPC . *H03K 19/0185* (2013.01); *H03K 19/018507* (2013.01); *H03M 1/38* (2013.01); *H03M 1/74* (2013.01)

(56) References Cited

U.S. PATENT DOCUMENTS

| | | | | |
|---|---|---|---|---|
| 2002/0105370 | A1* | 8/2002 | Ho | H03K 19/00315 327/333 |
| 2005/0242837 | A1* | 11/2005 | Shin | H03K 19/01721 326/81 |
| 2005/0270066 | A1* | 12/2005 | Kozawa | H03K 3/356113 326/81 |
| 2011/0204921 | A1* | 8/2011 | Yamaguchi | H03K 19/018521 326/81 |
| 2014/0333365 | A1* | 11/2014 | Takahashi | H03K 3/356017 327/333 |

FOREIGN PATENT DOCUMENTS

| | | | |
|---|---|---|---|
| JP | 2002-344303 | A | 11/2002 |
| JP | 2004-260263 | A | 9/2004 |
| JP | 2011-176767 | A | 9/2011 |

\* cited by examiner

FIG. 12

| RESET SIGNAL xRST | NUMBER OF TIMES OF COMPARISON | COMPARISON RESULT (DIFFERENTIAL OUTPUT) | DAC CONTROL SIGNAL |
|---|---|---|---|
| 0 | — | — | DACp7←1<br>DACp0~6←0<br>DACn7←1<br>DACn0~6←0 |
| 1 | 0 (IMMEDIATELY AFTER SAMPLING) | HIGH | DACn7←0 |
| 1 | 0 (IMMEDIATELY AFTER SAMPLING) | LOW | DACp7←0 |
| 1 | m (≥1) | HIGH | DACp(7−m)←1 |
| 1 | m (≥1) | LOW | DACn(7−m)←1 |

FIG. 14

| RESET SIGNAL xRST | NUMBER OF TIMES OF COMPARISON | COMPARISON RESULT (DIFFERENTIAL OUTPUT) | DAC CONTROL SIGNAL |
|---|---|---|---|
| 0 | — | — | DACp7←0<br>DACp0~6←1<br>DACn7←0<br>DACn0~6←1 |
| 1 | 0 (IMMEDIATELY AFTER SAMPLING) | HIGH | DACn7←1 |
| 1 | 0 (IMMEDIATELY AFTER SAMPLING) | LOW | DACp7←1 |
| 1 | m (≥1) | HIGH | DACp(7−m)←0 |
| 1 | m (≥1) | LOW | DACn(7−m)←0 |

VOLTAGE CONVERSION CIRCUIT AND ELECTRONIC DEVICE

CROSS REFERENCE TO RELATED APPLICATIONS

This application is a U.S. National Phase of International Patent Application No. PCT/JP2016/071978 filed on Jul. 27, 2016, which claims priority benefit of Japanese Patent Application No. JP 2015-220039 filed in the Japan Patent Office on Nov. 10, 2015. Each of the above-referenced applications is hereby incorporated herein by reference in its entirety.

TECHNICAL FIELD

The present technology relates to a voltage conversion circuit and an electronic device. Specifically, this relates to a voltage conversion circuit which supplies a voltage according to an input range in an analog to digital converter and the like, and an electronic device.

BACKGROUND ART

Conventionally, an analog to digital converter (ADC) is provided for converting an analog signal from a sensor and an antenna to a digital signal in various types of electronic apparatuses for measuring and performing wireless communication. There are various types of ADCs, but a successive approximation type ADC is widely used because of its small power consumption and circuit scale.

This successive approximation type ADC is generally provided with a comparator, a plurality of capacitors connected in parallel to the comparator, a voltage conversion circuit which supplies a voltage to the capacitors, and a logic circuit which controls operation of the voltage conversion circuit (refer to, for example, Patent Document 1). For example, a complementary MOS (CMOS) inverter is used as the voltage conversion circuit. In the successive approximation type ADC, the logic circuit inputs a high level or low level control signal to each of the voltage conversion circuits (CMOS inverters) on the basis of the comparison result of the comparator. On the basis of the control signal, the CMOS inverter supplies either a source potential (high level) of a P-type transistor or a source potential (low level) of an N-type transistor to the capacitor. Then, the comparator performs comparison a plurality of times, and outputs a digital signal including comparison results thereof as a result of AD conversion.

In such successive approximation type ADC, when an input of a very small analog signal is assumed, in order to convert the minute analog signal with a high degree of accuracy, it is necessary to improve resolution of the ADC. This resolution is ability indicating how fine a unit in which the ADC may convert the analog signal. In general, the resolution is represented by a value obtained by dividing an input range being a range of the analog signal on which the AD conversion may be performed by $2^m$ (m is the number of bits of the digital signal), and the smaller the value, the higher the resolution. Therefore, if m is constant, the narrower the input range, the smaller the value obtained by dividing the input range by $2^m$ (that is, the resolution improves). Herein, when increasing a held voltage of the capacitor in the ADC having the configuration described above, the CMOS inverter supplies the source potential (high level) of the P-type transistor to the capacitor. On the other hand, when decreasing the held voltage of the capacitor, the CMOS inverter supplies the source potential (low level) of the N-type transistor to the capacitor. Since the ADC may perform the AD conversion on the analog signal within the range of fluctuation of the held voltage, the range of the fluctuation corresponds to the input range of the ADC. Assuming that the low level is constant, this input range becomes narrower as the high level (that is, the source potential of the P-type transistor) supplied to the capacitor is lower. Therefore, as the source potential is lowered, the resolution is improved.

CITATION LIST

Patent Document

Patent Document 1: Japanese Patent Application Laid-Open No. 2004-260263

SUMMARY OF THE INVENTION

Problems to be Solved by the Invention

However, in the above-described conventional technology, as the source potential of the P-type transistor is lowered in order to improve the resolution, the operation speed of the CMOS inverter decreases. This is because, the lower the source potential, the lower a gate-source voltage of the P-type transistor and the lower a switching speed of the P-type transistor. Increasing the source potential (that is, the output level of the CMOS inverter) increases the operation speed of the CMOS inverter, but the input range is widened and the resolution of the ADC is reduced. In this manner, the higher an output level of the CMOS inverter, the higher the operation speed of the CMOS inverter, but the lower the resolution of the ADC. For this reason, it is difficult to improve the operation speed of the voltage conversion circuit such as the CMOS inverter without lowering the resolution (that is, without increasing the output level).

The present technology is achieved in view of such a situation and an object thereof is to improve the operation speed of the voltage conversion circuit without increasing the output level of the voltage conversion circuit.

Solutions to Problems

The present technology is achieved for solving the above-described problem, and a first aspect thereof is a voltage conversion circuit provided with a high-voltage side transistor which outputs a predetermined high voltage higher than a predetermined reference voltage, and a gate control unit which generates a predetermined control voltage higher than the predetermined high voltage from an input signal and applies the predetermined control voltage between a gate and a source of the high-voltage side transistor to allow the high-voltage side transistor to output the predetermined high voltage. As a result, there is an effect that the control voltage higher than a predetermined high voltage is applied between the gate and the source of the high-voltage side transistor.

In addition, in the first aspect, the high-voltage side transistor may be a P-type transistor. As a result, there is an effect that the control voltage higher than a predetermined high voltage is applied between the gate and the source of the P-type transistor.

Also, in the first aspect, the gate control unit may be provided with a capacitor one end of which is connected to the gate of the high-voltage side transistor, a preceding-stage transistor which supplies the predetermined high voltage to the one end of the capacitor on the basis of the input signal, and a first inverter which supplies a voltage higher than the predetermined high voltage to the other end of the capacitor on the basis of the input signal. As a result, there is an effect that the high voltage is supplied to one end of the capacitor and the voltage higher than the high voltage is applied to the other end.

Also, in the first aspect, a reference voltage side transistor which outputs the predetermined reference voltage may be further provided. As a result, there is an effect that the reference voltage is output.

Also, in the first aspect, the first inverter may supply the voltage higher than the high voltage to the other end of the capacitor on the basis of the input signal and allow the reference voltage side transistor to output the predetermined reference voltage by the voltage. As a result, there is an effect that the reference voltage side transistor outputs the reference voltage by the voltage higher than the high voltage.

Also, in the first aspect, the gate control unit may be further provided with a second inverter which allows the reference voltage side transistor to output the predetermined reference voltage on the basis of the input signal. As a result, there is an effect that the reference voltage side transistor outputs the reference voltage by the second inverter.

Also, in the first aspect, the high-voltage side transistor may be an N-type transistor. As a result, there is an effect that the control voltage higher than a predetermined high voltage is applied between the gate and the source of the N-type transistor.

Also, a second aspect of the present technology is an electronic device provided with a voltage conversion circuit provided with a high-voltage side transistor which outputs a predetermined high voltage higher than a predetermined reference voltage, and a gate control unit which generates a predetermined control voltage higher than the predetermined high voltage from an input signal and applies the predetermined control voltage between a gate and a source of the high-voltage side transistor to allow the high-voltage side transistor to output the predetermined high voltage, and a logic circuit which generates the input signal and supplies the input signal to the voltage conversion circuit. As a result, there is an effect that the control voltage higher than a predetermined high voltage is applied between the gate and the source of the high-voltage side transistor.

Also, in the first aspect, the gate control unit is provided with a capacitor one end of which is connected to the gate of the high-voltage side transistor, a preceding-stage transistor which supplies the high voltage to the one end of the capacitor in a case where the input signal is one of a binary value, and a first inverter which supplies a voltage higher than the high voltage to the other end of the capacitor in a case where the input signal is one of the binary value, in which the logic circuit may invert the input signal at regular intervals in a case where a period during which the input signal is the other of the binary value exceeds a predetermined time. As a result, there is an effect that the capacitor is charged at regular intervals.

Effects of the Invention

According to the present technology, it is possible to obtain an excellent effect that the operation speed of the voltage conversion circuit may be improved without increasing the output level of the voltage conversion circuit. Meanwhile, the effects are not necessarily limited to the effects herein described and may include any of the effects described in the present disclosure.

BRIEF DESCRIPTION OF DRAWINGS

FIG. 12 is a view for explaining operation of the logic circuit in the first embodiment of the present technology.

FIG. 14 is a view for explaining operation of a logic circuit in a variation of the first embodiment of the present technology.

MODE FOR CARRYING OUT THE INVENTION

Modes for carrying out the present technology (hereinafter, referred to as embodiments) are hereinafter described. The description is given in the following order.
1. First embodiment (example in which voltage higher than reference voltage is applied to P-type transistor)
2. Second embodiment (example in which voltage higher than reference voltage is applied to P-type transistor and different voltage is applied to N-type transistor)
3. Third embodiment (example in which voltage higher than reference voltage is applied to P-type transistor on the basis of one of two control signals)
4. Fourth embodiment (example in which voltage higher than reference voltage is applied to N-type transistor)

1. First Embodiment

[Configuration Example of Electronic Device]

Figure 1:
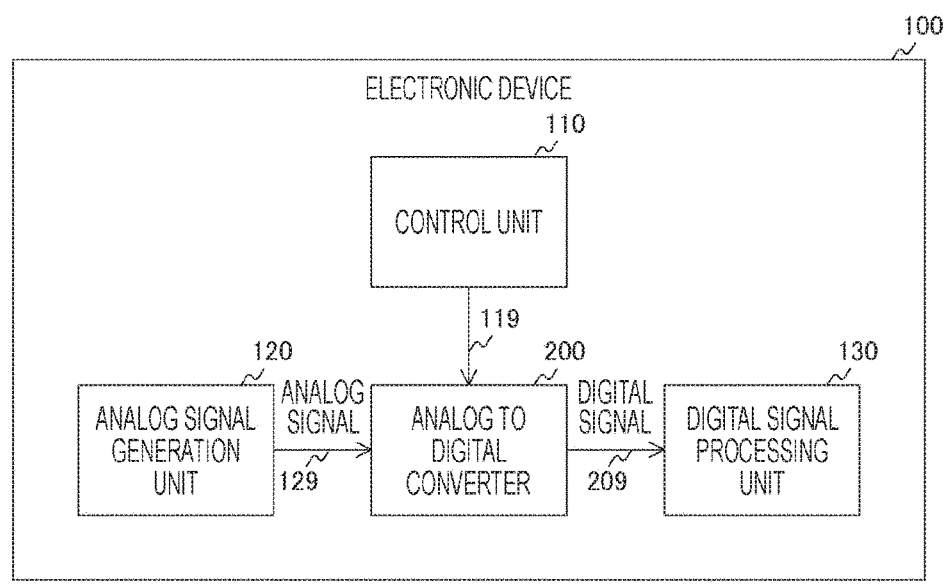
FIG. 1 is a block diagram illustrating a configuration example of an electronic device in a first embodiment of the present technology.

FIG. 1 is a block diagram illustrating a configuration example of an electronic device 100 in a first embodiment. The electronic device 100 is provided with a control unit 110, an analog signal generation unit 120, an analog to digital converter 200, and a digital signal processing unit 130.

The analog signal generation unit 120 generates an analog signal and supplies the same to the analog to digital converter 200 via a signal line 129. For example, a sensor such as a temperature sensor and an acceleration sensor, and an amplifier which amplifies a signal from an antenna is used as the analog signal generation unit 120.

The control unit 110 controls an entire electronic device 100. The control unit 110 controls the analog to digital converter 200, for example, to execute AD conversion at a constant sampling period.

The analog to digital converter 200 converts the analog signal to a digital signal under the control of the control unit 110. The analog to digital converter 200 supplies the converted digital signal to the digital signal processing unit 130 via the signal line 209.

The digital signal processing unit 130 executes predetermined processing on the digital signal. For example, the digital signal processing unit 130 executes processing of reducing noise of the digital signal, processing of normalizing the digital signal, or modulation processing and demodulation processing.

Meanwhile, although the control unit 110, the analog signal generation unit 120, the analog to digital converter 200, and the digital signal processing unit 130 are arranged in the same device, they may also be dispersedly arranged in a plurality of devices. For example, the control unit 110, the analog signal generation unit 120, and the analog to digital converter 200 may be arranged in a digital output sensor, and the digital signal processing unit 130 may be arranged in an information processing device.

[Configuration Example of Analog to Digital Converter]

Figure 2:
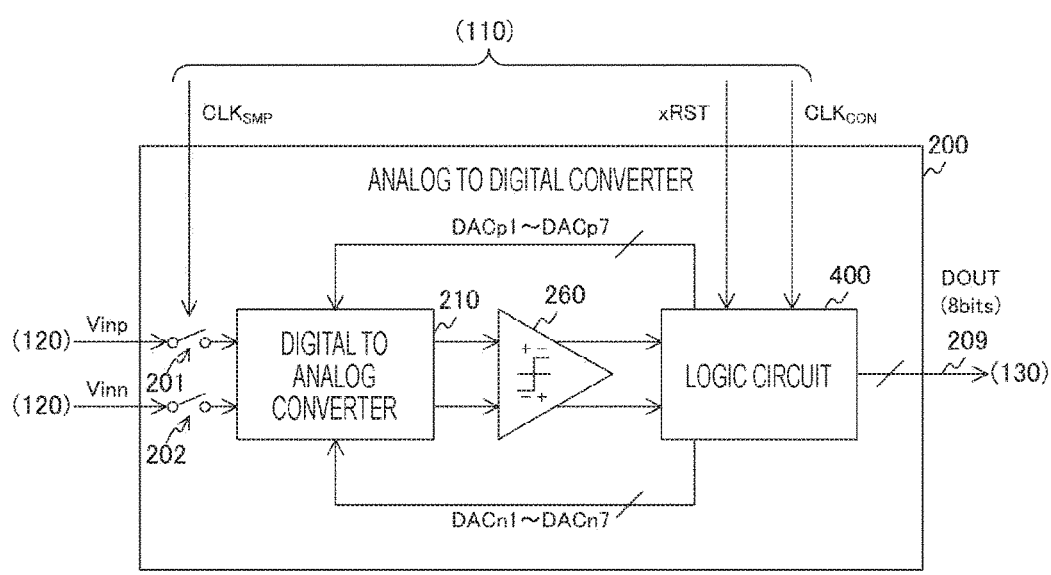
FIG. 2 is a block diagram illustrating a configuration example of an analog to digital converter in the first embodiment of the present technology.

FIG. 2 is a block diagram illustrating a configuration example of the analog to digital converter 200 in the first embodiment. The analog to digital converter 200 is provided with switches 201 and 202, a digital to analog converter 210, a comparator 260, and a logic circuit 400.

The switches 201 and 202 input the analog signal to the digital to analog converter 210 in synchronization with a sampling clock $CLK_{SMP}$. Herein, the analog signal from the analog signal generation unit 120 is a differential signal. A positive side input voltage $V_{inp}$ is input to an input terminal of the switch 201, and an output terminal thereof is connected to the digital to analog converter 210. A negative side input voltage $V_{inn}$ is input to an input terminal of the switch 202, and an output terminal thereof is connected to the digital to analog converter 210. Also, the switches 201 and 202 shift to a closed state, for example, in a case where the sampling clock $CLK_{SMP}$ is at a high level, and shift to an open state in other cases.

The digital to analog converter 210 holds the positive side input voltage $V_{inp}$ and the negative side input voltage $V_{inn}$ which are input, and updates the values under the control of the logic circuit 400. The digital to analog converter 210 supplies the held positive and negative side voltages to the comparator 260 as a positive side output voltage $V_{outp}$ and a positive side output voltage $V_{outn}$, respectively.

The comparator 260 compares the positive side output voltage $V_{outp}$ with the positive side output voltage $V_{outn}$. The comparator 260 supplies a comparison result to the logic circuit 400.

The logic circuit 400 controls the digital to analog converter 210 on the basis of the comparison result of the comparator 260 to update the voltage. The logic circuit 400 supplies a control signal of an initial value to the digital to analog converter 210 according to a reset signal xRST from the control unit 110. The control signal being a digital signal for controlling the voltage held by the analog to digital converter 200 includes positive side control signals DACp1 to DACp7 and negative side control signals DACn1 to DACn7. Each of the control signals is of one bit, and a level thereof is set to either a power-supply voltage VDD or a ground voltage GND. The power-supply voltage VDD is sufficiently higher than a threshold voltage of a transistor in an inverter 300.

Then, the logic circuit 400 newly generates the control signal from the comparison result of the comparator 260 in synchronization with a control clock $CLK_{CON}$ of a higher frequency than that of the sampling clock $CLK_{SMP}$, and supplies the same to the digital to analog converter 210. In addition, the logic circuit 400 outputs a digital signal DOUT including the comparison result of the comparator 260 to the digital signal processing unit 130 as a result of the AD conversion.

[Configuration Example of Digital to Analog Converter]

Figure 3:
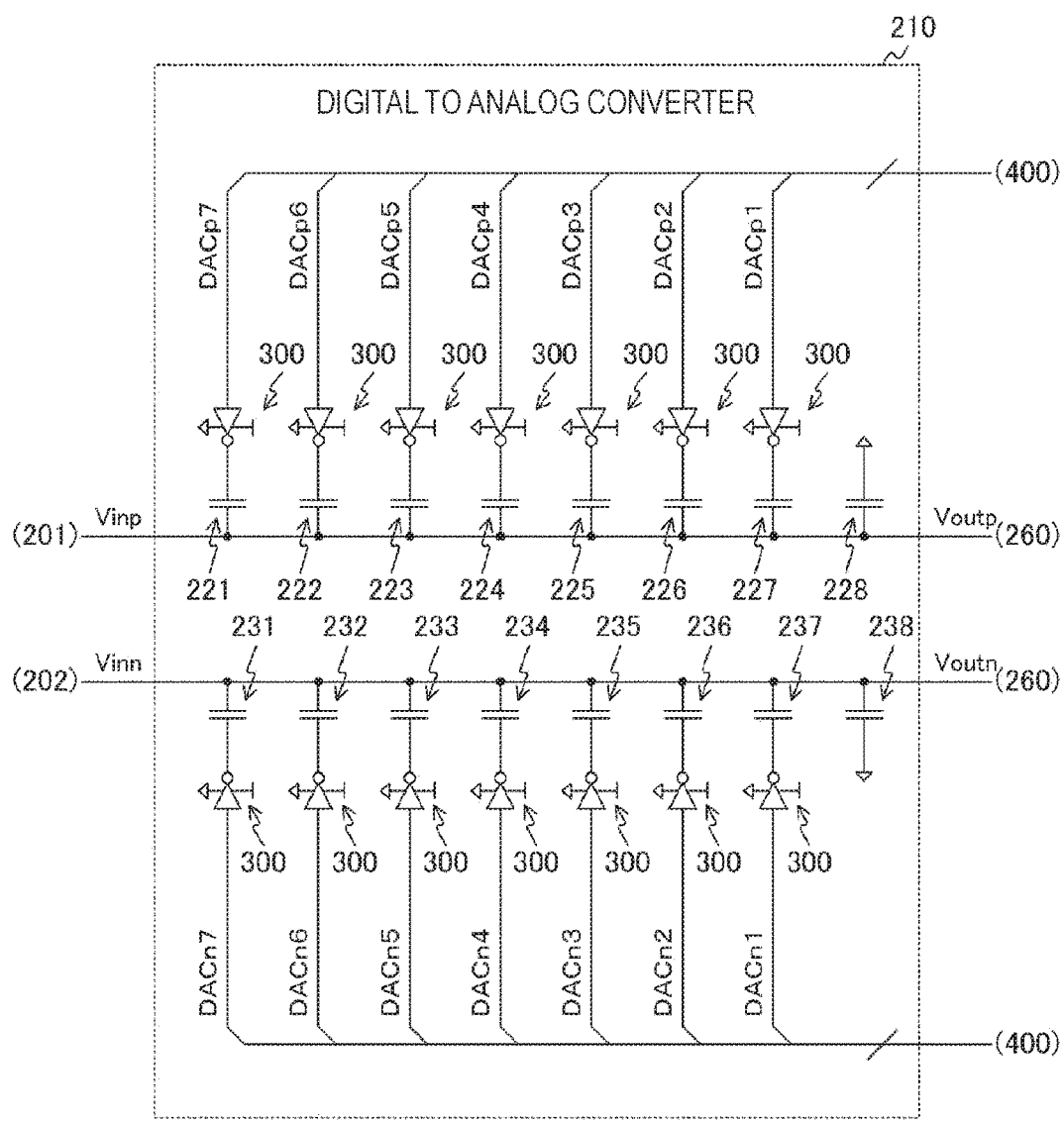
FIG. 3 is a circuit diagram illustrating a configuration example of a digital to analog converter in the first embodiment of the present technology.

FIG. 3 is a block diagram illustrating a configuration example of the digital to analog converter 210 in the first embodiment. The digital to analog converter 210 is provided with capacitors 221 to 228, capacitors 231 to 238, and a plurality of inverters 300. One inverter 300 is connected to each of the capacitors 221 to 227 and the capacitors 231 to 237.

Any one of the positive side control signals DACp1 to DACp7 is input to an input terminal of each of the inverters 300 corresponding to the capacitors 221 to 227, and an output terminal thereof is connected to the corresponding capacitor.

Also, any one of the negative side control signals DACn1 to DACn7 is input to an input terminal of each of the inverters 300 corresponding to the capacitors 231 to 237, and an output terminal thereof is connected to the corresponding capacitor.

One end of each of the capacitors 221 to 227 is connected to the corresponding inverter 300, and the other end thereof is connected to the switch 201 and a non-inverting input terminal (+) of the comparator 260. Also, one end of each of the capacitors 231 to 237 is connected to the corresponding inverter 300, and the other end thereof is connected to the switch 202 and an inverting input terminal (−) of the comparator 260.

The inverter 300 inverts the input control signal and outputs an inverted signal. The inverter 300 supplies the inverted signal to the corresponding capacitor. The voltage of this inverted signal is set to either a high level or a low level. For example, the ground voltage GND is used as the low level voltage in this case. Also, the high level voltage in this case is a predetermined voltage lower than the power-supply voltage VDD and higher than the low level. In this example, for example, a reference voltage $V_{ref}$ from a band gap reference (BGR) circuit is used as the high level voltage. It is only required that these high level and low level are different voltages, and they are not limited to the ground voltage GND and the reference voltage $V_{ref}$. For example, the reference voltage may be set to the low level and a predetermined voltage higher than the reference voltage may be set to the high level. In a case where the power-supply voltage VDD is of 1.2 volt (V), 0.7 volt (V) is used, for example, as the high level ($V_{ref}$). Also, the inverter 300 is an example of a voltage conversion circuit recited in claims.

The capacitors 221 to 227 hold the voltages supplied from the corresponding inverters. The capacitors 231 to 237 hold the voltages supplied from the corresponding inverters.

Also, the capacitors 221 to 227 have different capacitances. For example, the capacitance of the capacitor 221 is represented as 64 $C_0$ if unit capacitance is $C_0$. Also, the capacitance of the capacitor 222 is 32 $C_0$, and the capacitance of the capacitor 223 is 16 $C_0$. The capacitance of the capacitor 224 is 8 $C_0$, and the capacitance of the capacitor 225 is 4 $C_0$. The capacitance of the capacitor 226 is 2 $C_0$, and the capacitance of the capacitor 227 is $C_0$.

Also, the capacitors 231 to 237 have different capacitances. For example, the capacitance of the capacitor 231 is 64 $C_0$. Also, the capacitance of the capacitor 232 is 32 $C_0$, and the capacitance of the capacitor 233 is 16 $C_0$. The capacitance of the capacitor 234 is 8 $C_0$, and the capacitance of the capacitor 235 is 4 $C_0$. The capacitance of the capacitor 236 is 2 $C_0$, and the capacitance of the capacitor 237 is $C_0$.

One end of the capacitor 228 is connected to the switch 201 and the non-inverting input terminal (+) of the comparator 260, and the ground voltage GND is applied to the other end thereof. Also, one end of the capacitor 238 is connected to the switch 202 and the inverting input terminal (−) of the comparator 260, and the ground voltage GND is applied to the other end thereof. The capacitance of these capacitors is, for example, $C_0$.

Meanwhile, although the analog to digital converter 200 is provided with a total of 16 capacitors, the number of provided capacitors depends on resolution, and is not limited to 16.

A voltage ($V_{inp}$−$V_{inn}$) of the analog signal input to the analog to digital converter 200 is held in (that is, sampled by) all the capacitors (221 to 228 and 231 to 238) in synchronization with the sampling clock $CLK_{SMP}$. Then, on the basis of the comparison result of the comparator 260, the logic circuit 400 updates the control signal such that an input voltage ($V_{outp}$−$V_{outn}$) of the comparator 260 becomes zero.

By setting the inverted signal of the inverter 300 on the positive side from the low level (GND) to the high level ($V_{ref}$) by the control signal, it is possible to update the held voltage of the capacitor on the positive side to increase the positive side output voltage $V_{outp}$. On the other hand, by setting the output of the inverter 300 on the positive side from the high level to the low level, the positive side output voltage $V_{outp}$ may be decreased. Also, by setting the inverted signal of the inverter 300 on the negative side from the low level to the high level by the control signal, it is possible to update the held voltage of the capacitor on the negative side to increase the negative side output voltage $V_{outn}$. On the other hand, by setting the output of the inverter 300 on the negative side from the high level to the low level, the negative side output voltage $V_{outn}$ may be decreased.

Herein, the resolution of the analog to digital converter 200 is represented by a value obtained by dividing an input range which is a range of the analog signal on which the AD conversion may be performed by a value corresponding to a data size of the converted digital signal. For example, if the data size of the digital signal is of m bits, the resolution is obtained by dividing the input range by $2^m$. In the configuration described above, as the number of capacitors increases, the number of bits of the digital signal increases. When there are eight capacitors on the positive side, it is converted to an eight-bit digital signal. Also, as the value of the reference voltage $V_{ref}$ from the inverter 300 is smaller, the input range of the analog to digital converter 200 becomes narrower. Therefore, the resolution of the analog to digital converter 200 improves as the number of capacitors is larger and the value of the reference voltage $V_{ref}$ is smaller. The number of capacitors is determined under constraints of a circuit scale and a cost. If the number of capacitors is kept constant under the constraints, the resolution improves as the value of the reference voltage $V_{ref}$ is smaller.

Meanwhile, although the analog to digital converter 200 performs the AD conversion on the differential signal ($V_{inp}$ and $V_{inn}$) this may also perform the AD conversion on a single end signal. In addition, although the inverter 300 is provided in a successive approximation type analog to digital converter 200, this may also be provided in an analog to digital converter other than the successive approximation type.

Figure 4:
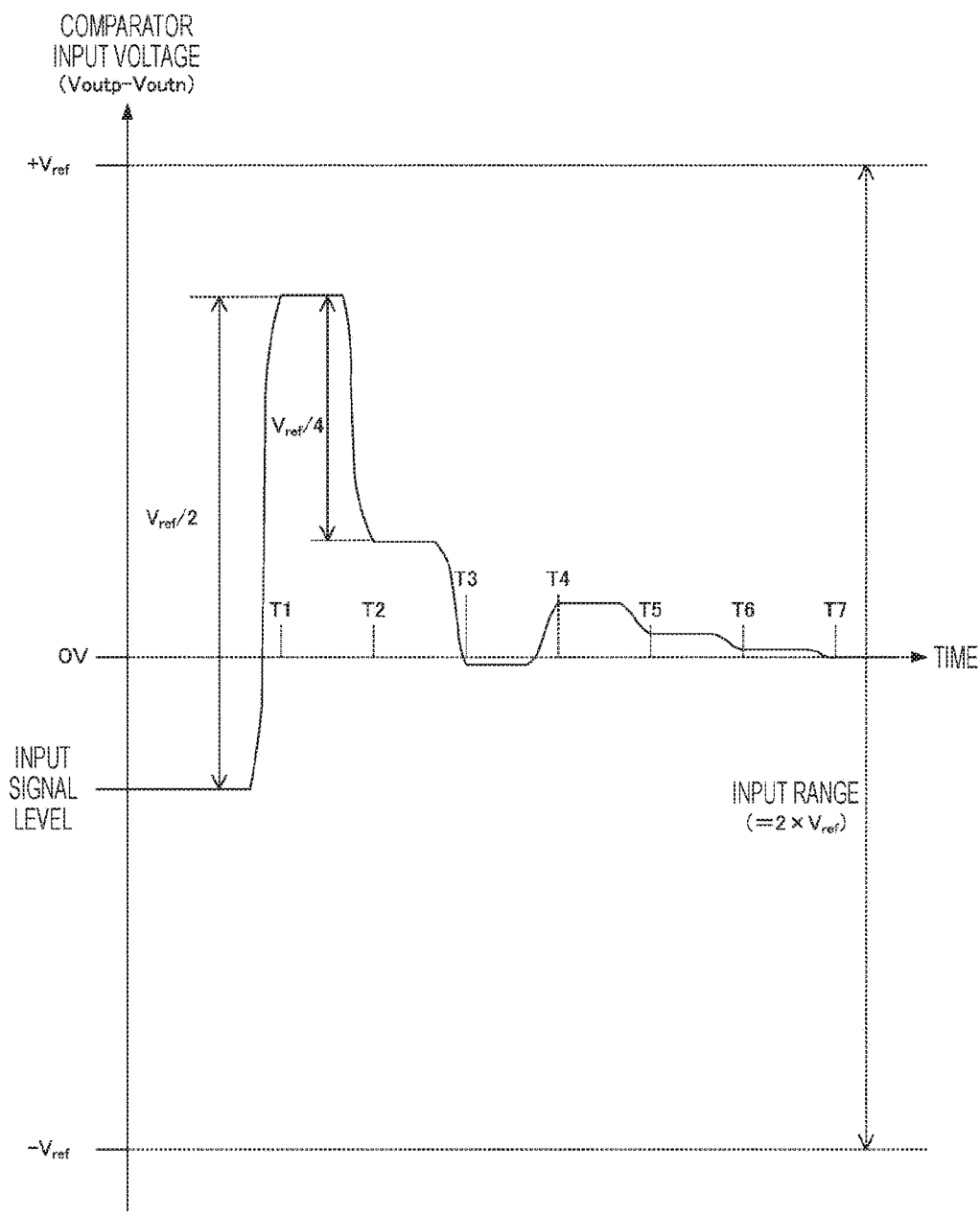
FIG. 4 is a view illustrating an example of fluctuation of a comparator input voltage in the first embodiment of the present technology.

FIG. 4 is a view illustrating an example of fluctuation of the comparator input voltage in the first embodiment. In the drawing, the input voltage ($V_{outp}$−$V_{outn}$) of the comparator 260 is plotted along the ordinate, and time is plotted along the abscissa.

Before time T1, the analog to digital converter 200 samples a level ($V_{inp}$−$V_{inn}$) of the input signal. This level is supposed to be 0 volt (V) or lower. At that time, the comparator 260 outputs a low level as a comparison result.

At time T1, the logic circuit 400 increases the positive side output voltage $V_{outp}$ by $V_{ref}/2$ by the control signal according to the comparison result. As a result, it is assumed that the input voltage ($V_{outp}$−$V_{outn}$) of the comparator 260 increases to exceed 0 volt (V). At that time, the comparator 260 outputs a high level as the comparison result.

At time T2, the logic circuit 400 decreases the positive side output voltage $V_{outp}$ by $V_{ref}/4$ by the control signal according to the comparison result. As a result, it is assumed that the input voltage ($V_{outp}$−$V_{outn}$) of the comparator 260 decreases to exceed 0 volt (V) after the decrease. At that time, the comparator 260 outputs a high level as the comparison result.

Thereafter, similarly, the logic circuit 400 controls the input voltage ($V_{outp}$−$V_{outn}$) of the comparator 260 to be 0 volt (V) on the basis of the comparison result of the comparator 260. Also, an absolute value of the increasing and decreasing voltage becomes smaller with each comparison. The ADC which controls the input voltage according to the comparison result of the comparator in this manner is referred to as a successive approximation type ADC. In this successive approximation type analog to digital converter 200, the comparison is performed by the number of times corresponding to the number of bits of the digital signal.

Also, the input range of the analog to digital converter 200 depends on the reference voltage $V_{ref}$ output from the inverter, as described above. For example, the range from $-V_{ref}$ to $+V_{ref}$ is the input range.

[Configuration Example of Inverter]

Figure 5:
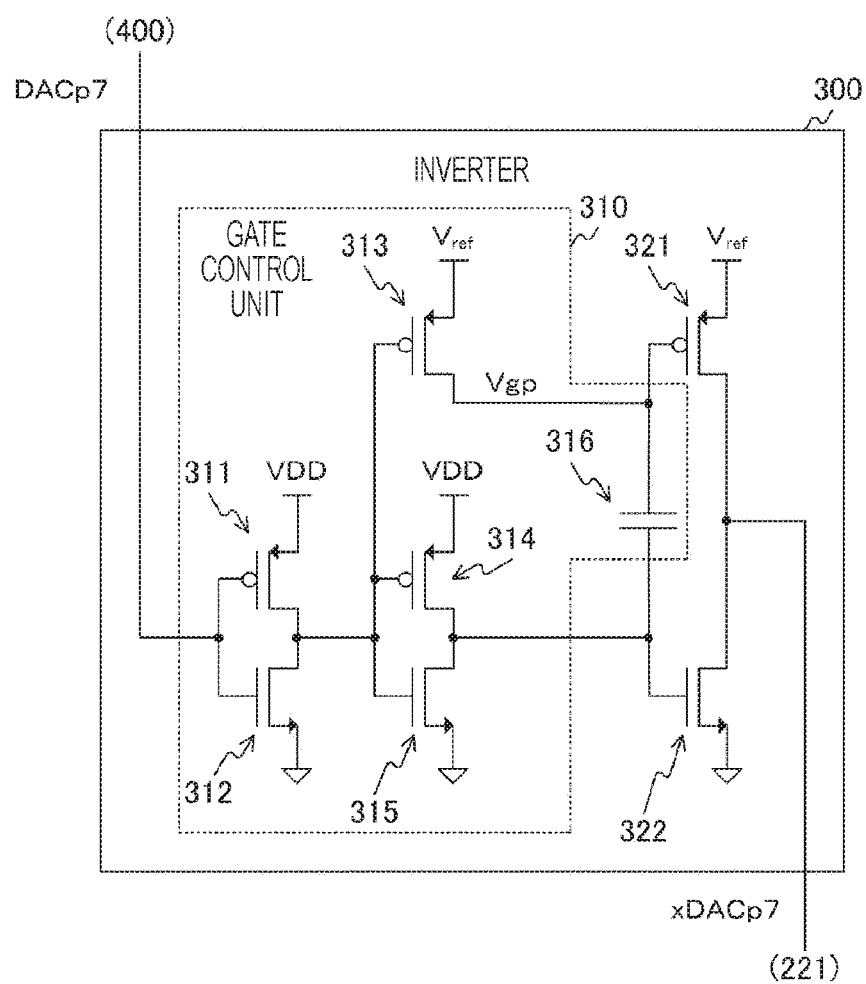
FIG. 5 is a circuit diagram illustrating a configuration example of an inverter in the first embodiment of the present technology.

FIG. 5 is a circuit diagram illustrating a configuration example of the inverter 300 in the first embodiment. The inverter 300 is provided with a P-type transistor 321, an N-type transistor 322, and a gate control unit 310. The gate control unit 310 is provided with P-type transistors 311, 313, and 314, N-type transistors 312 and 315, and a capacitor 316. As the P-type transistors 311, 313, 314, and 321, for example, a P-type metal-oxide-semiconductor (MOS) transistor is used. Also, ass the N-type transistors 312, 315, and 322, for example, an N-type MOS transistor is used.

The P-type transistor 311 and the N-type transistor 312 are connected in series between a power-supply terminal and a ground terminal. The control signal (DACn7 and the like) is input to gates of the P-type transistor 311 and the N-type transistor 312, and drains thereof are connected in common to gates of the P-type transistors 313 and 314 and the N-type transistor 315.

The reference voltage $V_{ref}$ is applied to a source of the P-type transistor 313, and a drain thereof is connected to the capacitor 316 and a gate of the P-type transistor 321.

The P-type transistor 314 and the N-type transistor 315 are connected in series between the power-supply terminal and the ground terminal. Drains of the P-type transistor 314 and the N-type transistor 315 are commonly connected to the capacitor 316 and a gate of the N-type transistor 322.

One end of the capacitor 316 is connected to the P-type transistors 313 and 321, and the other end thereof is connected to the P-type transistor 314 and the N-type transistors 315 and 322.

Also, the reference voltage $V_{ref}$ is applied to a source of the P-type transistor 321, and the ground voltage GND is applied to a source of the N-type transistor 322. In addition, drains of the P-type transistor 321 and the N-type transistor 322 are commonly connected to the output terminal of the inverter 300.

Herein, in general, the smaller a gate width of the P-type transistor is made, the more the fluctuation of the gate capacitance in an on-state and an off-state may be suppressed in the P-type transistor. If the fluctuation in the gate capacitance of the P-type transistor 321 is large, the held voltage of the capacitor 316 might fluctuate. Due to this fluctuation in the held voltage, a gate-source voltage of the P-type transistor 321 on a subsequent stage of the capacitor 316 might decrease, and on-resistance of the P-type transistor 321 might increase relatively. Therefore, from the viewpoint of suppressing the increase in the on-resistance, it is desirable to decrease the gate width W of the P-type transistor 321. However, when the gate width W is decreased, the on-resistance of the P-type transistor 321 increases. Meanwhile, since the gate capacitance becomes smaller as a gate length L of the P-type transistor becomes shorter, it is desirable to set the gate length of the P-type transistor 321 to a minimum value.

According to the above-described configuration, when the control signal (DACp7 and the like) is input to the inverter 300, an inverted signal (xDACp7 and the like) obtained by inverting the signal is output. The high level of this control signal is the power-supply voltage VDD and the low level thereof is the ground voltage GND. On the other hand, the high level of the inverted signal is the reference voltage $V_{ref}$ and the low level thereof is the ground voltage GND. In this manner, the inverter 300 is used to convert the voltage from the power-supply voltage VDD to the reference voltage $V_{ref}$.

Meanwhile, although the inverter 300 is provided in the analog to digital converter 200, it is not limited to this configuration. For example, the inverter 300 may also be provided in a level shift circuit which converts the voltage.

Figure 6:
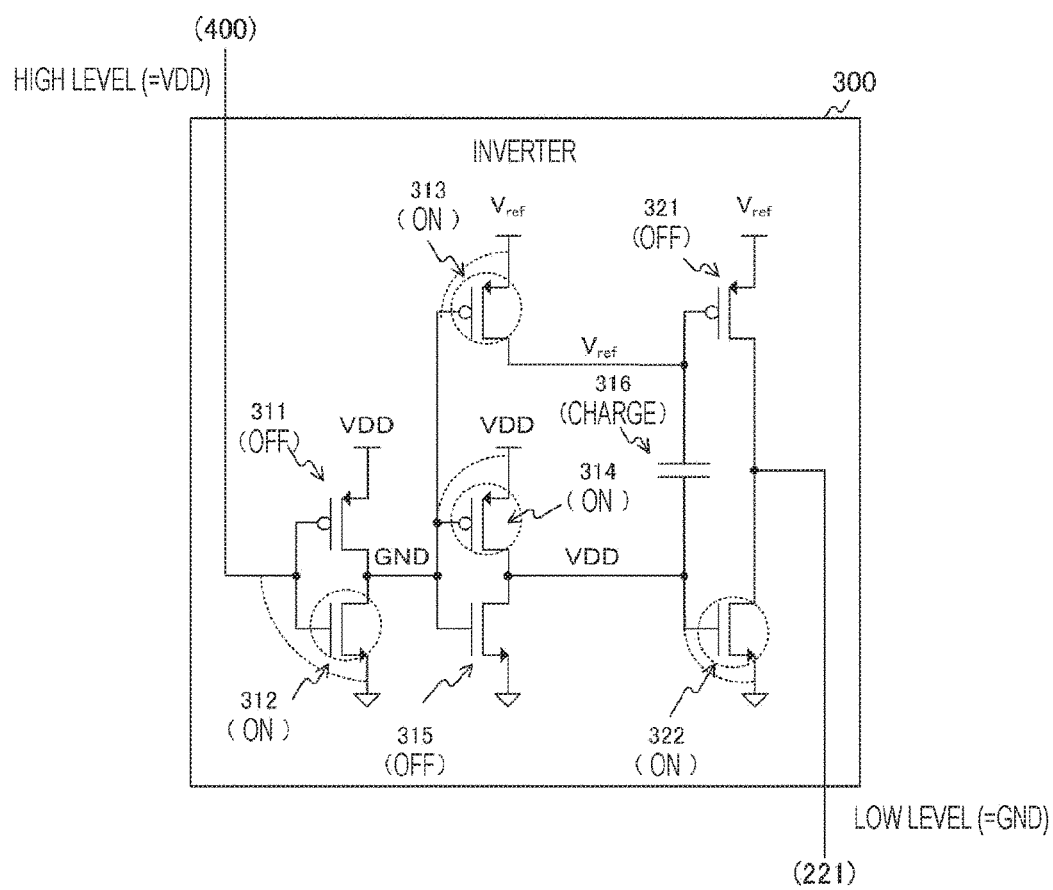
FIG. 6 is a view illustrating an example of a state of the inverter in a case where a high level is input in the first embodiment of the present technology.

FIG. 6 is a view illustrating an example of a state of the inverter 300 in a case where the high level is input in the first embodiment. When the control signal of the high level (power-supply voltage VDD) is input, only the N-type transistor 312 out of the P-type transistor 311 and the N-type transistor 312 shifts to the on-state, and the ground voltage GND is output from the drain thereof.

The P-type transistor 313 shifts to the on-state by the ground voltage GND from the N-type transistor 312, and the reference voltage $V_{ref}$ is output from the drain thereof. Meanwhile, the P-type transistor 313 is an example of a preceding-stage transistor recited in claims.

Also, only the P-type transistor 314 out of the P-type transistor 314 and the N-type transistor 315 shifts to the on-state, and the power-supply voltage VDD is output from the drain thereof. Meanwhile, a circuit including the P-type transistor 314 and the N-type transistor 315 is an example of a first inverter recited in claims.

The N-type transistor 322 shifts to the on-state by the power-supply voltage VDD from the P-type transistor 314, and the ground voltage GND is output from the drain thereof. Meanwhile, the N-type transistor 322 is an example of a reference voltage-side transistor recited in claims.

Also, the reference voltage $V_{ref}$ is applied to one end on a P-type transistor 321 side of the capacitor 316, and the power-supply voltage VDD is applied to the other end thereof. Therefore, the capacitor 316 is charged with a differential voltage of $V_{ref}$–VDD.

In this manner, when the high level (power-supply voltage VDD) is input to the inverter 300, the low level (ground voltage GND) is output. At that time, the capacitor 316 is charged with a voltage of $V_{ref}$–VDD. For example, in a case where the power-supply voltage VDD is of 1.2 V and the reference voltage $V_{ref}$ is of 0.7 V, the capacitor 316 is charged with –0.5 V.

Figure 7:
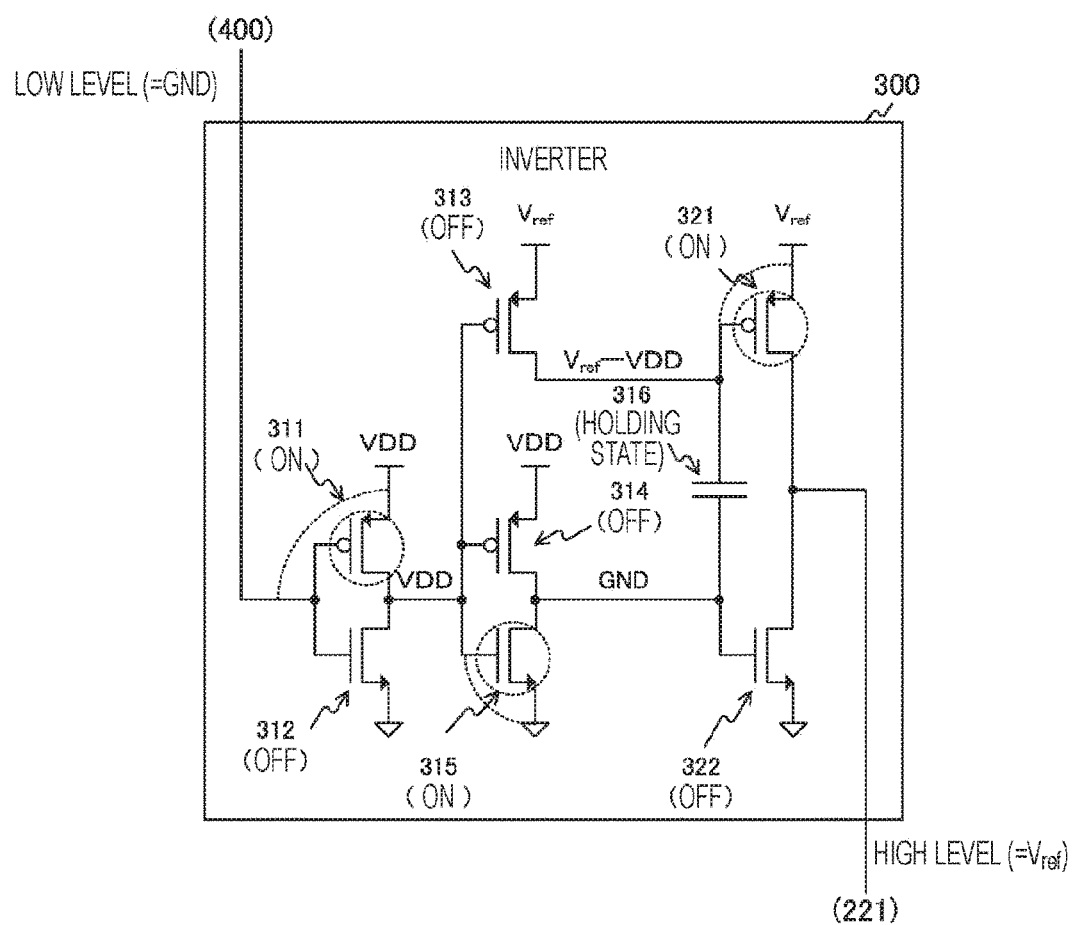
FIG. 7 is a view illustrating an example of a state of the inverter in a case where a low level is input in the first embodiment of the present technology.

FIG. 7 is a view illustrating an example of a state of the inverter 300 in a case where the low level is input in the first embodiment. When the control signal of the low level (ground voltage GND) is input, only the P-type transistor 311 out of the P-type transistor 311 and the N-type transistor 312 shifts to the on-state, and the power-supply voltage VDD is output from the drain thereof.

Only the N-type transistor 315 out of the P-type transistor 314 and the N-type transistor 315 shifts to the on-state by the power-supply voltage VDD from the P-type transistor 311, and the ground voltage GND is output from the drain thereof. Also, the P-type transistor 313 is put into the off-state. Because the P-type transistor 313 is put into the off-state, linked with transition of the drain of the N-type transistor 315 to the ground voltage GND, the held voltage of the capacitor 316 transits to $V_{ref}$–VDD. By this $V_{ref}$–VDD, the P-type transistor 321 transits to the on-state and the reference voltage $V_{ref}$ is output from the drain thereof. Meanwhile, the P-type transistor 321 is an example of a high-voltage side transistor recited in claims.

In this manner, when the low level (GND) is input to the inverter 300, the high level ($V_{ref}$) is output. At that time, a gate potential $V_{gp}$ of the P-type transistor 321 becomes $V_{ref}$–VDD. On the other hand, since the reference voltage $V_{ref}$ is applied to the source of the P-type transistor 321, the gate-source voltage of the P-type transistor 321 becomes approximately the power-supply voltage VDD regardless of the value of $V_{ref}$.

Herein, in general, the lower the gate-source voltage, the lower a switching speed when the P-type transistor transits from the off-state to the on-state. Therefore, in a general CMOS inverter having a configuration in which the P-type transistor and the N-type transistor are connected in series, as a source potential ($V_{ref}$) of the P-type transistor is made smaller, the gate-source voltage might decrease and the switching speed might decrease. Due to this decrease in switching speed, a settling time which is a time until the input voltage of the comparator 260 is settled becomes longer. In the analog to digital converter using such CMOS inverter, since the CMOS inverter is switched with each comparison, an AD conversion speed decreases due to an increase in settling time.

On the other hand, the inverter 300 is provided with the gate control unit 310 which sets the gate potential $V_{gp}$ of the P-type transistor 321 to a value (=$V_{ref}$−VDD) lower than 0 volt (V). Therefore, the gate-source voltage of the P-type transistor 321 becomes a value (=VDD) higher than $V_{ref}$ in a case where the gate control unit 310 is not provided, and the switching speed may be improved.

However, by providing the gate control unit 310, the number of transistors in the inverter 300 increases. Therefore, it is necessary to set a parameter of the transistor, the power-supply voltage VDD and the like such that an operation speed of an entire inverter 300 is improved even when considering the increase.

A rise time from the off-state to the on-state of the P-type transistor in a case where the power-supply voltage VDD is applied between the gate and the source is set to $t_{rise}1$ and the rise time in a case where the reference voltage $V_{ref}$ is applied between the gate and the source is set to $T_{rise}2$. Also, in the inverter 300 provided with the gate control unit 310, since the three P-type transistors (311, 315, and 321) shift to the on-state, a total rising delay time $T_{rise}1$ is $3 \times t_{rise}1$. Therefore, by setting the parameter (gate length, gate width and the like) such that $T_{rise}1$ (=$3 \times t_{rise}1$)<$T_{rise}2$ is satisfied, the switching speed is improved as compared with the configuration without the gate control unit 310.

For example, the gate length L of each of the P-type transistors (321 and the like) is set to 60 nanometers (nm), the gate width W thereof is set to 28000 nanometers (nm), and the threshold voltage thereof is set to 0.48 volt (V). Also, the gate length L of each of the N-type transistors (322 and the like) is set to 60 nanometers (nm), the gate width W thereof is set to 1440 nanometers (nm), and the threshold voltage thereof is set to 0.48 volt (V). Also, the power-supply voltage VDD is set to 1.1 volt (V). The source potential ($V_{ref}$) of the P-type transistor is set to 0.7 volt (V). Simulation was carried out using a simulation program with integrated circuit emphasis (SPICE) on the basis of these set values.

As a result of the simulation, in the CMOS inverter of a comparative example without the gate control unit 310 provided, the delay time ($T_{rise}2$) with which the output transits from the low level to the high level was approximately 2.0 nanoseconds (ns). In contrast, in the inverter 300 provided with the gate control unit 310, the delay time ($T_{rise}1$) is approximately 0.2 nanoseconds (ns), which is shortened by approximately 1.8 nanoseconds (ns). In this manner, by improving the operation speed of the entire inverter 300, an operation speed of an entire analog to digital converter 200 may be improved.

Figure 8:
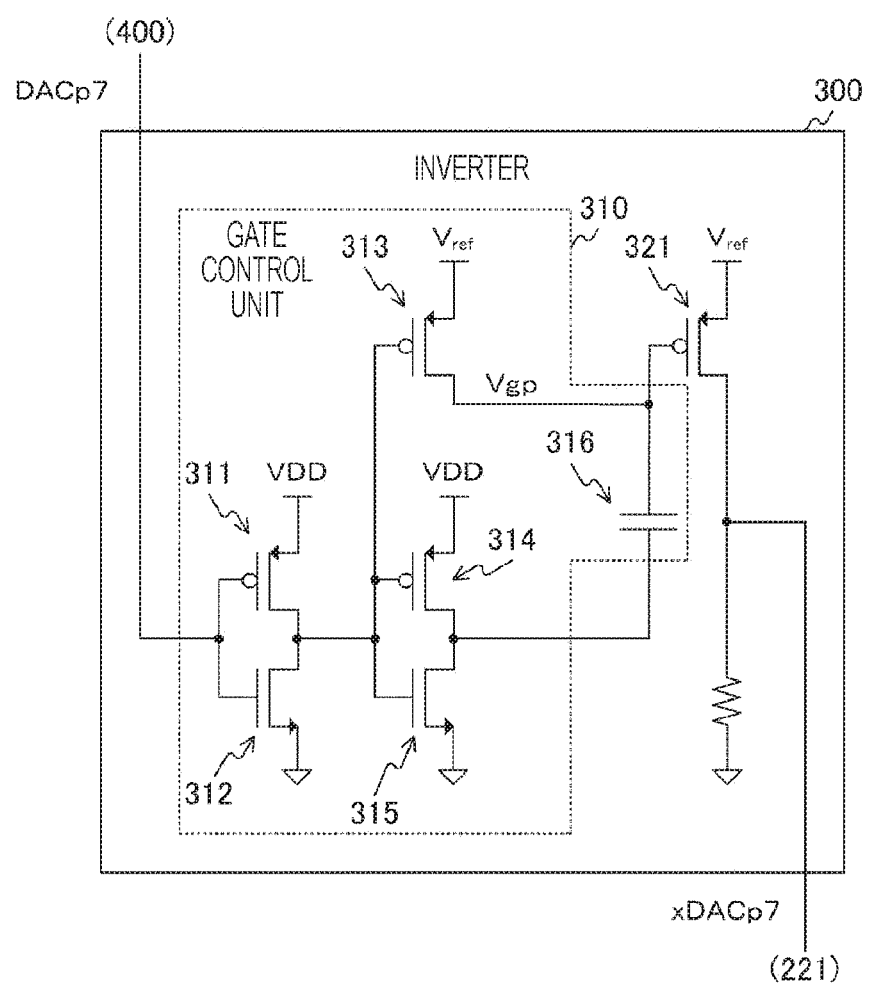
FIG. 8 is a circuit diagram illustrating a configuration example of the inverter in which an N-type transistor is replaced with a resistor in the first embodiment of the present technology.

Meanwhile, as illustrated in FIG. 8, a resistor may also be inserted in place of the N-type transistor 322. In this case, the drains of the P-type transistor 314 and the N-type transistor 315 are connected only to the capacitor 316.

Figure 9A:
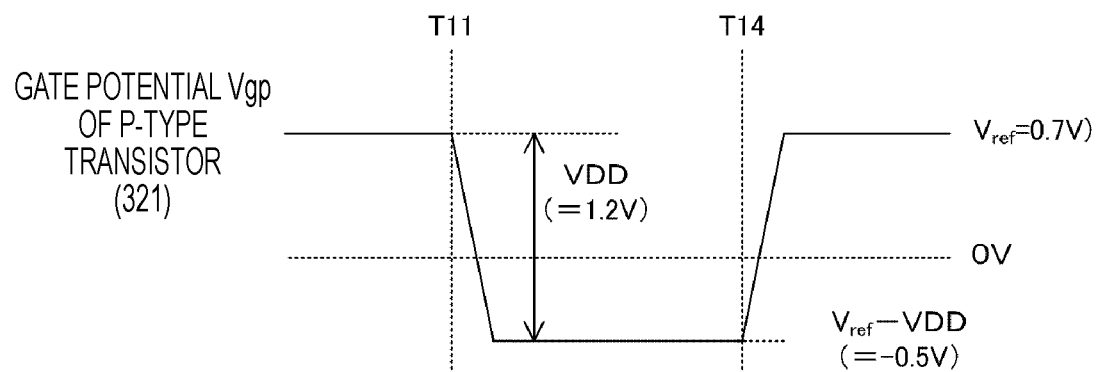
FIGS. 9a and 9b are views illustrating an example of fluctuation in gate potential and drain potential of a P-type transistor in the first embodiment of the present technology.
Figure 9B:
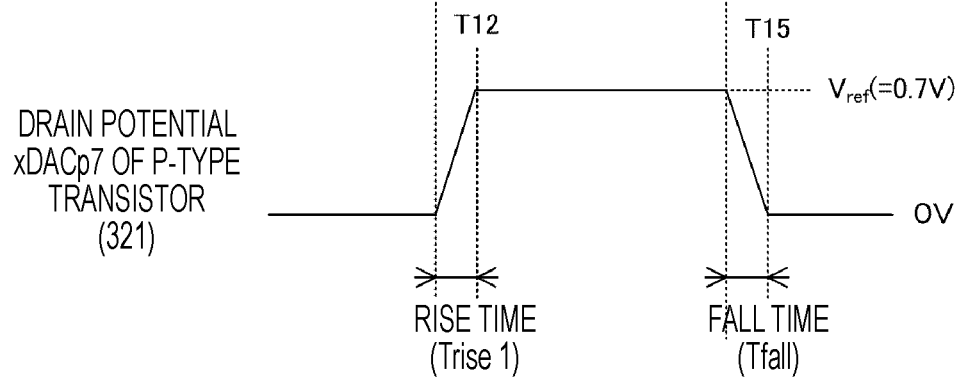

FIGS. 9a and 9b are views illustrating an example of fluctuation in gate potential and drain potential of the P-type transistor 313 in the first embodiment. FIG. 9a illustrates the fluctuation in gate potential Vgp of the P-type transistor 313, and FIG. 9b illustrates the fluctuation in drain potential xDACp7 of the P-type transistor 313.

At time T11, the gate potential $V_{gp}$ is the reference voltage $V_{ref}$, and the P-type transistor 313 is in the off-state. Then, at time T12, the gate potential is controlled to $V_{ref}$−VDD (=−0.5 V). The P-type transistor 321 transits to the on-state, and the drain potential thereof xDACp7 transits from a low level (=0 V) to a high level ($V_{ref}$=0.7 V).

Herein, since the source potential of the P-type transistor 313 is $V_{ref}$, the power-supply voltage VDD is applied between the gate and the source of the P-type transistor 313. Since this power-supply voltage is higher than $V_{ref}$, the rise time $T_{rise}1$ from T11 to T12 is shorter than that in a case where $V_{ref}$ is applied between the gate and the source of the P-type transistor 313.

In addition, when the gate potential $V_{gp}$ transits from the low level to the high level from time T14 to T15, the drain potential xDACp7 changes from the high level to the low level. At that time, the power-supply voltage VDD is applied between the gate and the source of the P-type transistor 313, so that the fall time $T_{fall}$ from T14 to T15 becomes sufficiently short.

Figure 10A:
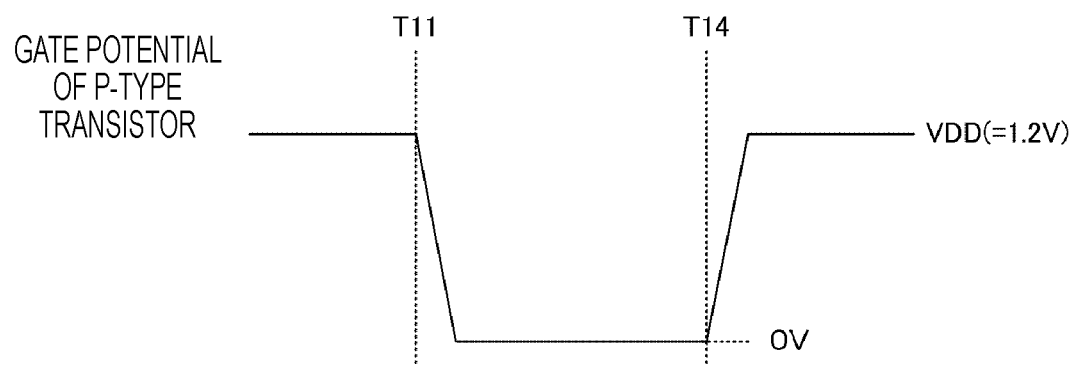
FIGS. 10a and 10b are views illustrating an example of fluctuation in gate potential and drain potential of a P-type transistor in a comparative example.
Figure 10B:
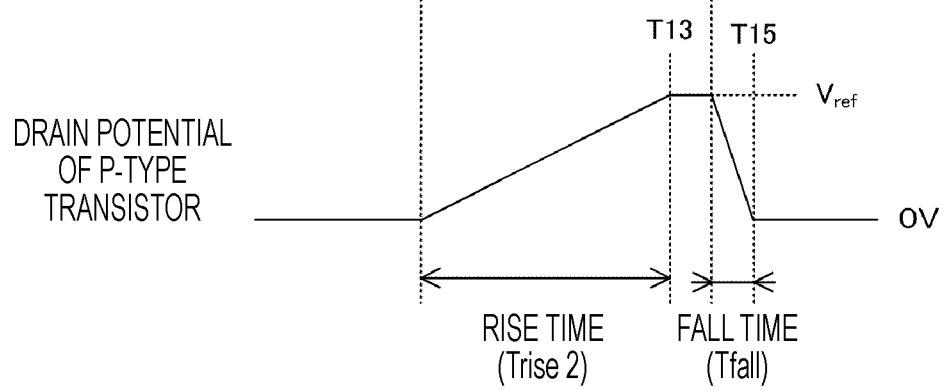

FIGS. 10a and 10b are views illustrating an example of fluctuation in gate potential and drain potential of the P-type transistor in a comparative example. In the inverter of this comparative example, the P-type transistor and the N-type transistor are connected in series between the power-supply terminal and the ground terminal, and the gate control unit 310 is not provided. FIG. 10a illustrates the fluctuation of the gate potential of the P-type transistor, and FIG. 10b illustrates the fluctuation of the drain potential of the P-type transistor.

When the gate potential $V_{gp}$ transits from the high level to the low level from time T11 to time T13, the drain potential changes from the low level (GND) to the high level ($V_{ref}$). Herein, since the source potential of the P-type transistor is $V_{ref}$, the reference voltage $V_{ref}$ is applied between the gate and the source of the P-type transistor 313. Since the reference voltage $V_{ref}$ is lower than the power-supply voltage VDD, the rise time $T_{rise}2$ from T11 to T13 becomes longer than the rise time $T_{rise}1$ when the power-supply voltage VDD is applied between the gate and the source.

[Configuration Example of Logic Circuit]

Figure 11:
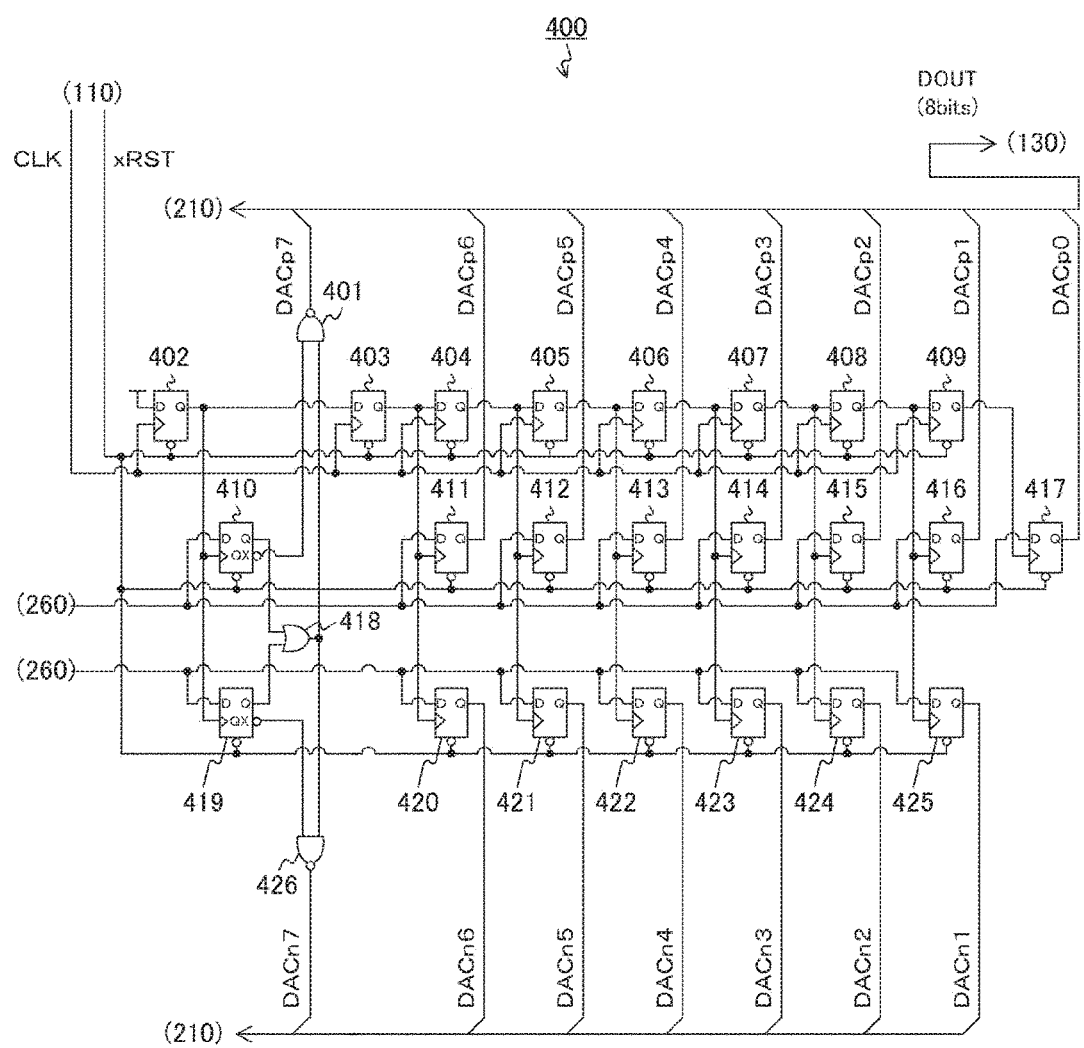
FIG. 11 is a circuit diagram illustrating a configuration example of a logic circuit in the first embodiment of the present technology.

FIG. 11 is a circuit diagram illustrating a configuration example of the logic circuit 400 in the first embodiment. The logic circuit 400 is provided with negative AND (NAND) gates 401 and 426, flip-flops 402 through 417, a logical sum (OR) gate 418, and flip-flops 419 through 425.

The flip-flop 402 holds a signal of a high level (power-supply voltage VDD) in synchronization with the clock signal CLK and supplies the held value to the flip-flops 403, 410, and 419. The flip-flop 403 holds the signal from the flip-flop 402 in synchronization with the clock signal CLK and supplies the held value to the flip-flops 404, 411, and 420. The flip-flop 404 holds the signal from the flip-flop 403 in synchronization with the clock signal CLK and supplies the held value to the flip-flops 405, 412, and 421.

The flip-flop 405 holds the signal from the flip-flop 404 in synchronization with the clock signal CLK and supplies the held value to the flip-flops 406, 413, and 422. The flip-flop 406 holds the signal from the flip-flop 405 in synchronization with the clock signal CLK and supplies the held value to the flip-flops 407, 414, and 423. The flip-flop 407 holds the signal from the flip-flop 406 in synchronization with the clock signal CLK and supplies the held value to the flip-flops 408, 415, and 424. The flip-flop 408 holds the signal from the flip-flop 407 in synchronization with the clock signal CLK and supplies the held value to the flip-flops 409, 416, and 425. The flip-flop 409 holds the signal from the flip-flop 408 in synchronization with the clock signal CLK and supplies the held value to the flip-flop 417.

The flip-flop 410 holds a value of the non-inverting output terminal (+) of the comparator 260 in synchronization with the signal from the flip-flop 402, and supplies the held value to the OR gate 418. Also, the flip-flop 410 supplies the inverted value of the held value to the NAND gate 401. The flip-flop 419 holds the value of the inverting output terminal (−) of the comparator 260 in synchronization with the signal from the flip-flop 402, and supplies the held value to the OR gate 418. Also, the flip-flop 419 supplies the inverted value of the held value to the NAND gate 426.

The OR gate 418 supplies the logical sum of the signals from the flip-flops 410 and 419 to the NAND gates 401 and 426.

The NAND gate 401 supplies the negative AND of the signals from the flip-flop 410 and the OR gate 418 to the digital to analog converter 210 as the control signal DACp7. The NAND gate 426 supplies the negative AND of the signals from the flip-flop 419 and the OR gate 418 to the digital to analog converter 210 as the control signal DACn7.

The flip-flop 411 holds the value of the non-inverting output terminal (+) of the comparator 260 in synchronization with the signal from the flip-flop 403 and supplies the held value as the control signal DACp6 to the digital to analog converter 210. The flip-flop 420 holds the value of the inverting output terminal (−) of the comparator 260 in synchronization with the signal from the flip-flop 403 and supplies the held value as the control signal DACn6 to the digital to analog converter 210.

The flip-flop 412 holds the value of the non-inverting output terminal (+) of the comparator 260 in synchronization with the signal from the flip-flop 404 and supplies the held value as the control signal DACp5 to the digital to analog converter 210. The flip-flop 421 holds the value of the inverting output terminal (−) of the comparator 260 in synchronization with the signal from the flip-flop 404 and supplies the held value as the control signal DACn5 to the digital to analog converter 210.

The flip-flop 413 holds the value of the non-inverting output terminal (+) of the comparator 260 in synchronization with the signal from the flip-flop 405 and supplies the held value as the control signal DACp4 to the digital to analog converter 210. The flip-flop 422 holds the value of the inverting output terminal (−) of the comparator 260 in synchronization with the signal from the flip-flop 405 and supplies the held value as the control signal DACn4 to the digital to analog converter 210.

The flip-flop 414 holds the value of the non-inverting output terminal (+) of the comparator 260 in synchronization with the signal from the flip-flop 406 and supplies the held value as the control signal DACp3 to the digital to analog converter 210. The flip-flop 423 holds the value of the inverting output terminal (−) of the comparator 260 in synchronization with the signal from the flip-flop 406 and supplies the held value as the control signal DACn3 to the digital to analog converter 210.

The flip-flop 415 holds the value of the non-inverting output terminal (+) of the comparator 260 in synchronization with the signal from the flip-flop 407 and supplies the held value as the control signal DACp2 to the digital to analog converter 210. The flip-flop 424 holds the value of the inverting output terminal (−) of the comparator 260 in synchronization with the signal from the flip-flop 407 and supplies the held value as the control signal DACn2 to the digital to analog converter 210.

The flip-flop 416 holds the value of the non-inverting output terminal (+) of the comparator 260 in synchronization with the signal from the flip-flop 408 and supplies the held value as the control signal DACp1 to the digital to analog converter 210. The flip-flop 425 holds the value of the inverting output terminal (−) of the comparator 260 in synchronization with the signal from the flip-flop 408 and supplies the held value as the control signal DACn1 to the digital to analog converter 210.

The flip-flop 417 holds the value of the non-inverting output terminal (+) of the comparator 260 in synchronization with the signal from the flip-flop 409 and outputs the held value as the control signal DACp0. An eight-bit signal including DACp0 to DACp7 is output as a digital signal DOUT to the digital signal processing unit 130.

Also, an inverted value of the reset signal xRST is input to a reset terminal of each of the flip-flops (402 and the like).

With the above-described configuration, the logic circuit 400 controls the digital to analog converter 210 on the basis of the comparison result of the comparator 260 to update the voltage.

[Operation Example of Logic Circuit]

FIG. 12 is a view for explaining operation of the logic circuit 400 in the first embodiment. When the reset signal xRST of "0" is input, the logic circuit 400 sets the control signal to the initial value. Specifically, the control signals DACp7 and DACn7 are initialized to "1", and the other control signals are initialized to "0". Also, in a case where the reset signal xRST is "1", the logic circuit 400 updates the control signal on the basis of the comparison result of the comparator 260. In a case where a result of 0th comparison immediately after the sampling is the high level, the logic circuit 400 updates the control signal DACn7 to "0". On the other hand, in a case where the result of the 0th comparison is the low level, the logic circuit 400 updates the control signal DACp7 to "0".

Then, in a case where a result of mth comparison (m is an integer of not smaller than 1) is the high level, the logic circuit 400 updates the control signal DACp(7-m) to "1". On the other hand, in a case where the result of the mth comparison is the low level, the logic circuit 400 updates the control signal DACn(7-m) to "1".

In this manner, according to the first embodiment of the present technology, since the voltage higher than the output level ($V_{ref}$) is applied between the gate and the source of the P-type transistor 321, it is possible to improve the operation speed of the P-type transistor 321 without increasing the output level.

[Variation]

In the first embodiment described above, the analog to digital converter 200 converts the voltage by the inverter 300, but the voltage may also be converted by a logic element other than the inverter. For example, it is also possible to convert the voltage by a buffer. An analog to digital converter 200 of a variation of the first embodiment is different from that of the first embodiment in that a buffer 301 is provided in place of the inverter 300.

Figure 13:
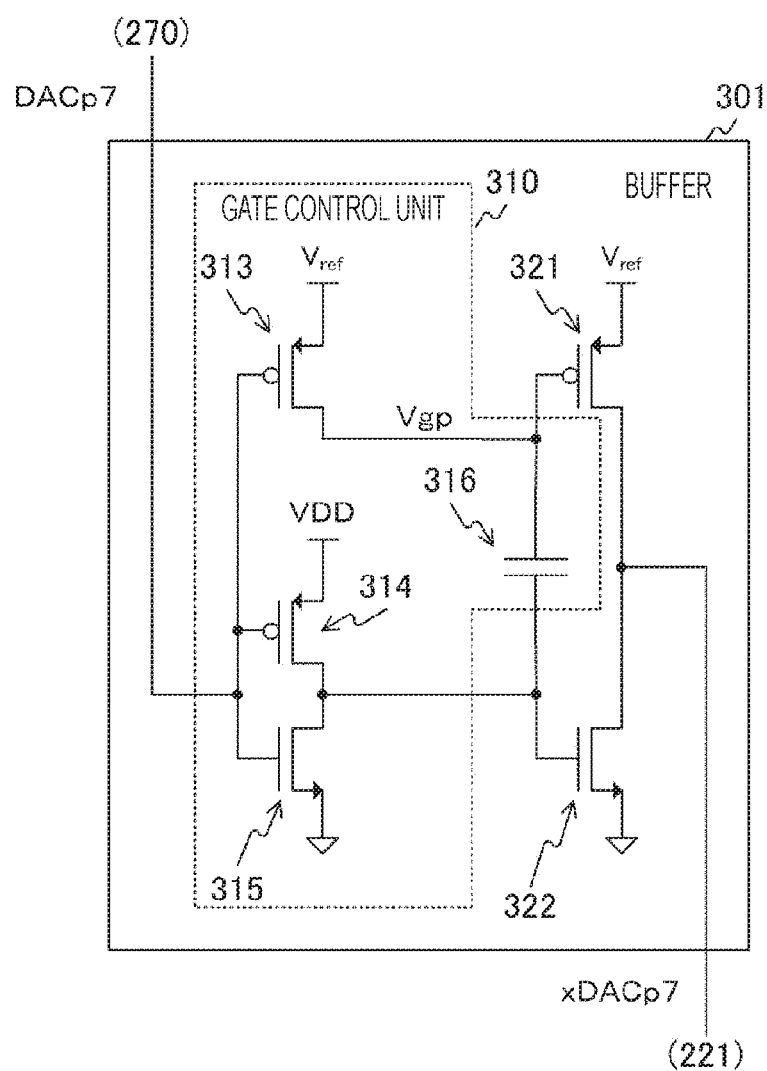
FIG. 13 is a circuit diagram illustrating a configuration example of a buffer in a variation of the first embodiment of the present technology.

FIG. 13 is a circuit diagram illustrating a configuration example of the buffer 301 in the variation of the first embodiment. The configuration of the buffer 301 is similar to that of the inverter 300 except that this is not provided with a P-type transistor 311 and an N-type transistor 312. However, the control signal is input to gates of P-type transistors 313 and 314 and an N-type transistor 315.

FIG. 14 is a view for explaining operation of a logic circuit 400 in the variation of the first embodiment. The operation of the logic circuit 400 in this variation is similar to that in the first embodiment except that a value of the control signal is inverted. For example, when a reset signal xRST of "0" is input, the logic circuit 400 initializes control signals DACp 7 and DACn7 to "0" and initializes the other control signals to "1".

In this manner, according to the variation of the first embodiment of the present technology, since the buffer 301 is provided as a logic element in place of the inverter 300, it is not necessary to provide the P-type transistor 311 and the N-type transistor 312, so that a circuit scale and a cost may be reduced.

2. Second Embodiment

In the above-described first embodiment, an inverter including a P-type transistor 314 and an N-type transistor 315 is commonly connected to each of a P-type transistor 321 and an N-type transistor 322. However, there is a case where necessary driving capability of an inverter on a preceding stage is different depending on a gate size of each of the P-type transistor 321 and the N-type transistor 322. An inverter 300 of a second embodiment is different from that of the first embodiment in that the driving capability of the inverter on the preceding stage may be adjusted according to the gate size of each of the P-type transistor 321 and the N-type transistor 322.

Figure 15:
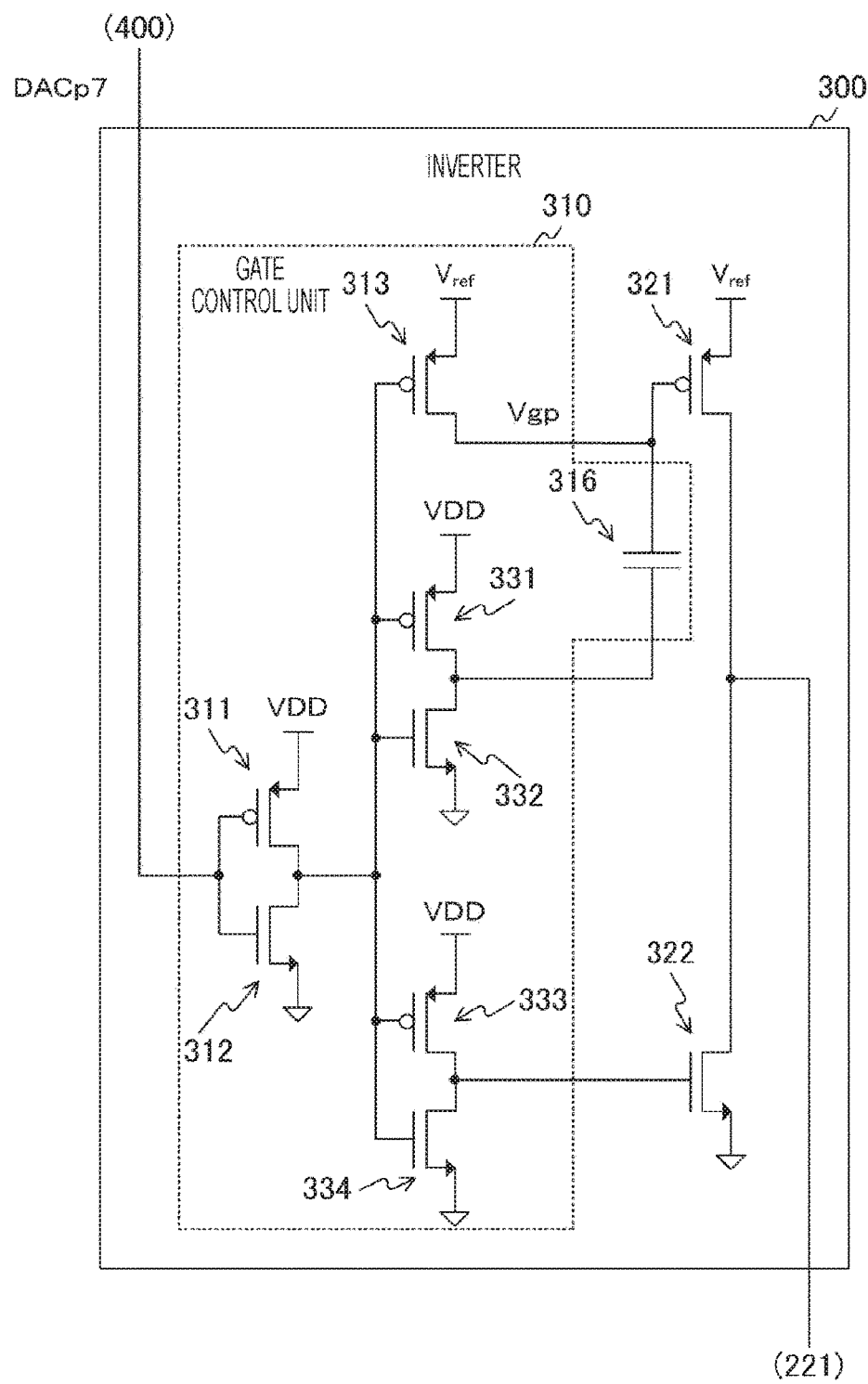
FIG. 15 is a circuit diagram illustrating a configuration example of an inverter in a second embodiment of the present technology.

FIG. 15 is a circuit diagram illustrating a configuration example of the inverter 300 in the second embodiment. This inverter 300 is different from that of the first embodiment in that P-type transistors 331 and 333 and N-type transistors 332 and 334 are provided in a gate control unit 310 in place of the P-type transistor 314 and the N-type transistor 315.

The P-type transistor 331 and the N-type transistor 332 are connected in series between a power-supply terminal and a ground terminal. Also, gates thereof are commonly connected to drains of a P-type transistor 311 and an N-type transistor 312, and drains thereof are connected to one end of a capacitor 316 in common. Meanwhile, an inverter including the P-type transistor 331 and the N-type transistor 332 is an example of a first inverter recited in claims.

The P-type transistor 333 and the N-type transistor 334 are connected in series between the power-supply terminal and the ground terminal. Also, gates thereof are commonly connected to the drains of the P-type transistor 311 and the N-type transistor 312, and drains thereof are connected to one end of a gate of the N-type transistor 322 in common. Meanwhile, an inverter including the P-type transistor 333 and the N-type transistor 334 is an example of a second inverter recited in claims.

In the above-described configuration, the driving capability of the inverter including the P-type transistor 331 and the N-type transistor 332 depends on the gate size (gate length L and gate width W) of the P-type transistor 321 on a subsequent stage. As the gate size increases, it is necessary to increase the driving capability of the inverter on the preceding stage (P-type transistor 331 and N-type transistor 332).

Similarly, the driving capability of the inverter including the P-type transistor 333 and the N-type transistor 334 depends on the gate size of the N-type transistor 322 on the subsequent stage. In this inverter also, it is necessary to increase the driving capability as the gate size of the N-type transistor 332 on the subsequent stage is larger.

As illustrated in FIG. 15, by dividing the inverter, it is possible to change the driving capability of the corresponding inverter according to the gate size of each of the P-type transistor 321 and the N-type transistor 322. Also, in order to shorten a rise time Trise1 in FIGS. 9a and 9b described above, it is necessary to increase the gate width W of the P-type transistor 321, and in order to shorten a fall time Tfall1, it is necessary to increase the gate width W of the N-type transistor 322. Therefore, it is possible to individually adjust the rise time Trise1 and the fall time Tfall1 by changing the driving capability of the inverter corresponding to each of the P-type transistor 321 and the N-type transistor 322.

In this manner, according to the second embodiment of the present technology, since different inverters are connected to the P-type transistor 321 and the N-type transistor 322, respectively, the driving capability of the inverter may be adjusted according to the gate size of each transistor.

3. Third Embodiment

In the first embodiment described above, in a case where a low level is input to an inverter 300, a capacitor 316 is put into a holding state to maintain a voltage of $V_{ref}$-VDD. However, as a low-level period becomes longer, the held voltage might fluctuate by leakage current from the capacitor 316 and the inverter 300 might malfunction. An inverter 300 of a third embodiment is different from that of the first embodiment in that the capacitor 316 is charged so as to suppress the fluctuation of the held voltage of the capacitor 316.

Figure 16:
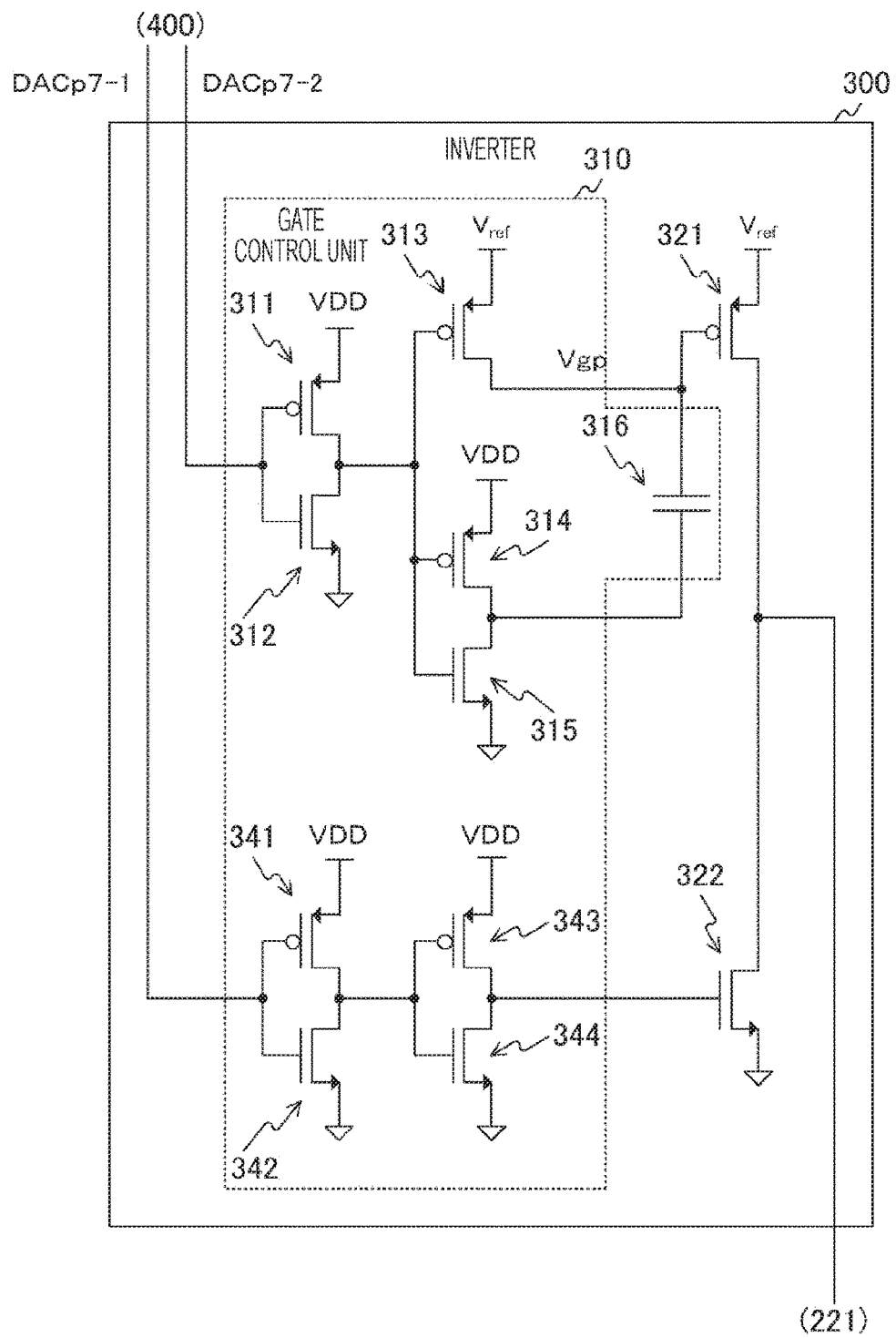
FIG. 16 is a circuit diagram illustrating a configuration example of an inverter in a third embodiment of the present technology.

FIG. 16 is a circuit diagram illustrating a configuration example of the inverter 300 in the third embodiment. The inverter 300 of the third embodiment is different from that of the first embodiment in that P-type transistors 341 and 343 and N-type transistors 342 and 344 are further provided in a gate control unit 310.

Also, two control signals are input to the inverter 300 of the third embodiment. For example, control signals DACp7-1 and DACp7-2 are input.

The P-type transistor 341 and the N-type transistor 342 are connected in series between a power-supply terminal and a ground terminal. Also, the control signal DACp7-1 is input to gates thereof and drains thereof are connected to gates of the P-type transistor 343 and the N-type transistor 344.

The P-type transistor 343 and the N-type transistor 344 are connected in series between a power-supply terminal and a ground terminal. Also, drains thereof are connected to a gate of an N-type transistor 322.

Also, the control signal DACp7-2 is input to gates of a P-type transistor 311 and an N-type transistor 312. Also, drains of a P-type transistor 314 and an N-type transistor 315 are connected only to the capacitor 316.

Figure 17:
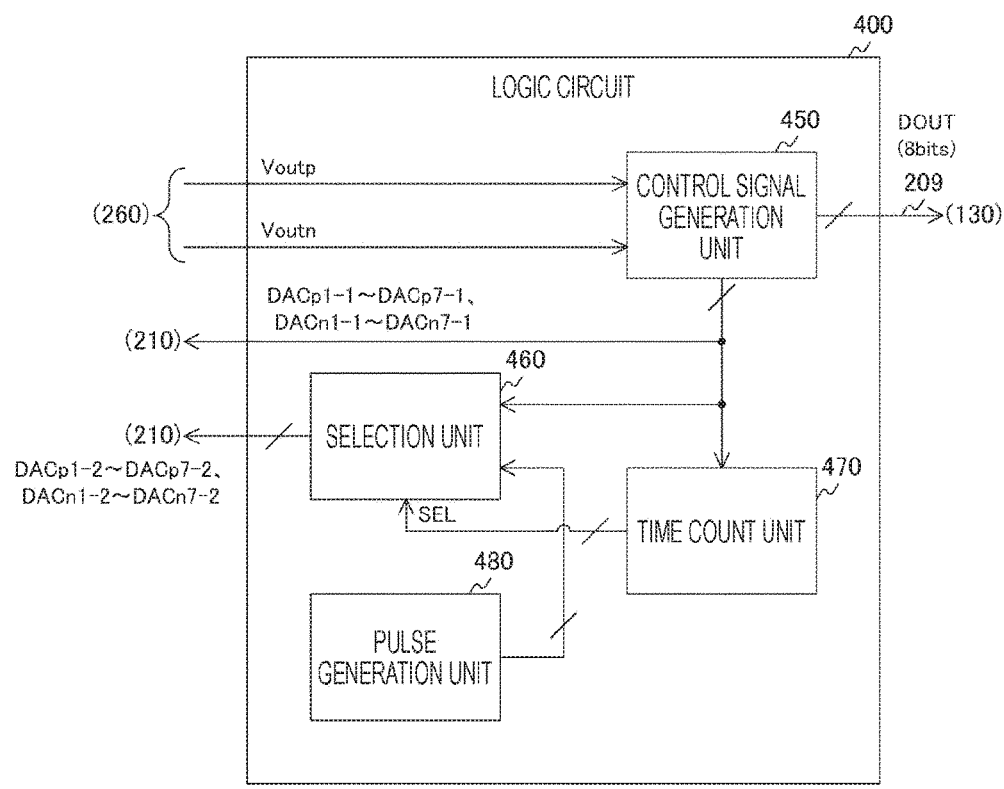
FIG. 17 is a block diagram illustrating a configuration example of a logic circuit in the third embodiment of the present technology.

FIG. 17 is a block diagram illustrating a configuration example of a logic circuit 400 in the third embodiment. The logic circuit 400 is provided with a control signal generation unit 450, a selection unit 460, a time count unit 470, and a pulse generation unit 480.

The control signal generation unit 450 generates a control signal on the basis of a comparison result of a comparator 260. The control signal generation unit 450 generates control signals DACp1 to DACp7 and control signals DACn1 to DAn7 by a circuit similar to that of the first embodiment illustrated in FIGS. 10a and 10b. Then, the control signal generation unit 450 supplies them as control signals DACp1-1 to DACp7-1 and DACn1-1 to DAn7-1 to the selection unit 460, the time count unit 470, and a digital to analog converter 210.

The time count unit 470 counts a time during which a state in which the control signal is a low level continues. The time count unit 470 counts the time during which the low level state continues for each of the control signals DACp1-1 to DACp7-1 and DACn1-1 to DAn7-1. Then, the time count unit 470 generates a selection signal SEL for each control signal on the basis of whether a duration time exceeds a predetermined allowable time. For example, in a period until the control signal becomes the high level after the duration time exceeds the allowable time, the high level is set to the corresponding selection signal SEL, and the low level is set in other periods. The time count unit 470 supplies each of the generated selection signals SEL to the selection unit 460.

The pulse generation unit 480 generates a pulse signal of a constant period for each control signal. The pulse generation unit 480 supplies each of the pulse signals to the selection unit 460.

The selection unit 460 selects either the control signal from the control signal generation unit 450 or the pulse signal. In a case where the selection signal SEL corresponding to the control signal is at the high level (that is, the duration of the low level exceeds the allowable time), the selection unit 460 selects the corresponding pulse signal. On the other hand, in a case where the selection signal SEL corresponding to the control signal is at the low level, the selection unit 460 selects the control signal. The selection unit 460 supplies the selected signal to the digital to analog converter 210 as the control signals DACp1-2 to DACp7-2 and DACn1-2 to DAn7-2.

Figure 18:
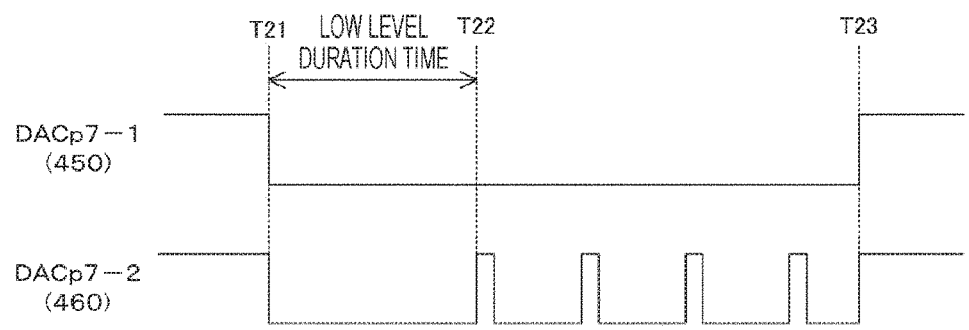
FIG. 18 is a timing chart illustrating an example of operation of the logic circuit in the third embodiment of the present technology.

FIG. 18 is a timing chart illustrating an example of operation of the logic circuit 400 in the third embodiment. It is assumed that the control signal DACp7-1 continues to be at the low level from time T21 and the duration of the low level exceeds the allowable time at T22. After time T22, the selection unit 460 in the logic circuit 400 selects the pulse signal and outputs the same as the control signal DACp7-2.

When the period during which the control signal DACp7-2 is at the low level becomes longer, the held voltage might fluctuate by the leakage current from the capacitor 316 and the P-type transistor 321 might shift from an on-state to an off-state. However, since the capacitor 316 is charged at regular intervals by the pulse signal, the fluctuation of the held voltage may be suppressed. Since this pulse signal is never input to the N-type transistor 322, there is no possibility that the N-type transistor 322 transits to the on-state and malfunction occurs.

As described above, according to the third embodiment of the present technology, when the period during which the control signal DACp7-2 is at the low level becomes longer, the logic circuit 400 transmits the pulse signal, so that the capacitor circuit 316 may be charged at regular intervals by the pulse signal. By this, the fluctuation of the held voltage of the capacitor 316 may be suppressed, and the malfunction may be prevented.

4. Fourth Embodiment

In the above-described first embodiment, a P-type transistor is used as a transistor which outputs a high level, but an N-type transistor may also be used in place of this. An inverter 300 of a fourth embodiment is different from that of the first embodiment in that the N-type transistor is used as the transistor which outputs the high level.

Figure 19:
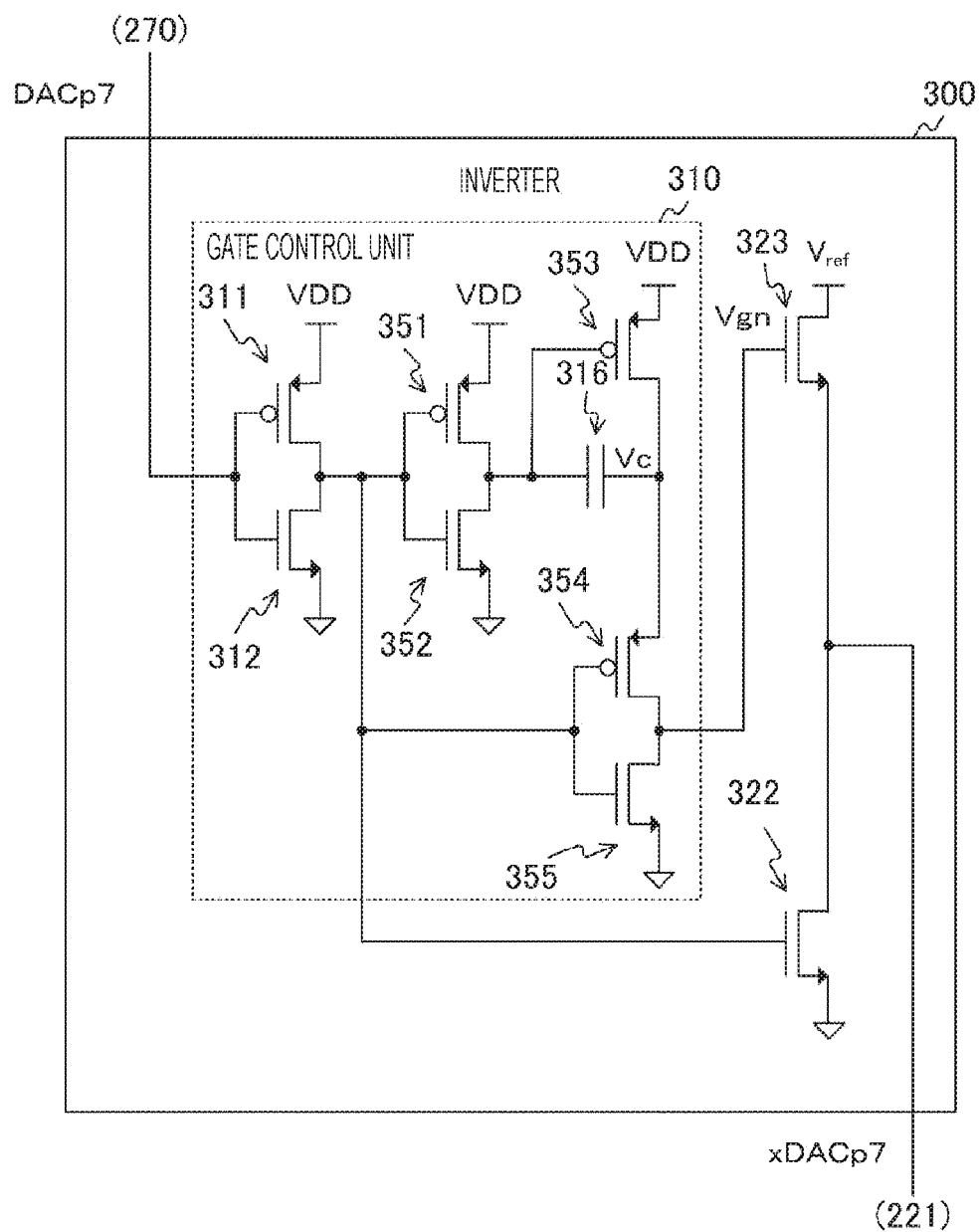
FIG. 19 is a circuit diagram illustrating a configuration example of an inverter in a fourth embodiment of the present technology.

FIG. 19 is a circuit diagram illustrating a configuration example of the inverter 300 in the fourth embodiment. This inverter 300 of the fourth embodiment is provided with P-type transistors 351, 353, and 354 and N-type transistors 352 and 355 in place of P-type transistors 313, 314, and 321 and an N-type transistor 315. Also, the inverter 300 is provided with an N-type transistor 323 in place of a P-type transistor 321.

Drains of a P-type transistor 311 and an N-type transistor 312 are connected in common to gates of the P-type transistors 351 and 354 and the N-type transistors 322, 352, and 355.

The P-type transistor 351 and the N-type transistor 352 are connected in series between a power-supply terminal and a ground terminal. Drains of the P-type transistor 351 and the N-type transistor 352 are connected in common to a capacitor 316 and a gate of the P-type transistor 353.

The P-type transistors 353 and 354 and the N-type transistor 355 are connected in series between a power-supply terminal and a ground terminal. In addition, a drain of the P-type transistor 353 and a source of the P-type transistor 354 are connected in common to the capacitor 316. Drains of the P-type transistor 354 and the N-type transistor 355 are connected in common to a gate of the N-type transistor 323.

One end of the capacitor 316 is connected to the drains of the P-type transistor 351 and the N-type transistor 352 and the gate of the P-type transistor 353. On the other hand, the other end of the capacitor 316 is connected to the drain of the P-type transistor 353 and the source of the P-type transistor 354.

A reference voltage $V_{ref}$ is applied to a source of the N-type transistor 323, and a drain thereof is connected to the N-type transistor 322 and an output terminal of the inverter 300.

With this configuration, when a low level is input to the inverter 300, the P-type transistor 353 shifts to an off-state, and a terminal of the capacitor 316 on a P-type transistor 354 side and the drain of the P-type transistor 354 become a floating node. As a result, a voltage of the capacitor 316 is held, and 2×VDD which is a voltage obtained by adding a terminal voltage Vc on the P-type transistor 354 side to a drain potential $V_{gn}$ of the P-type transistor 354 is applied to the gate of the N-type transistor 323. Since a source potential of the N-type transistor 323 is $V_{ref}$, a gate-source voltage of the N-type transistor 323 is 2×VDD−$V_{ref}$ (=1.7 V). This voltage is higher than $V_{ref}$ (=0.7 V), and a delay time of the N-type transistor 323 becomes sufficiently short.

Figure 20A:
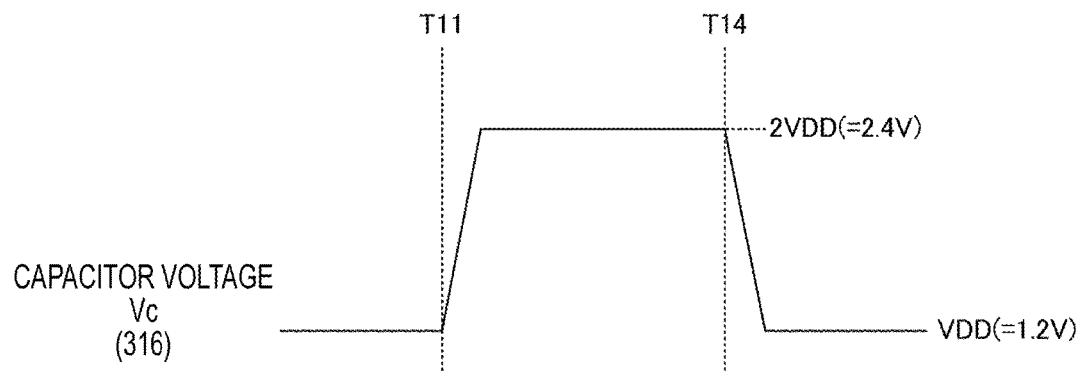
FIGS. 20a, 20b, and 20c are views illustrating an example of fluctuation of a held voltage of a capacitor and gate potential and drain potential of an N-type transistor in the fourth embodiment of the present technology.
Figure 20B:
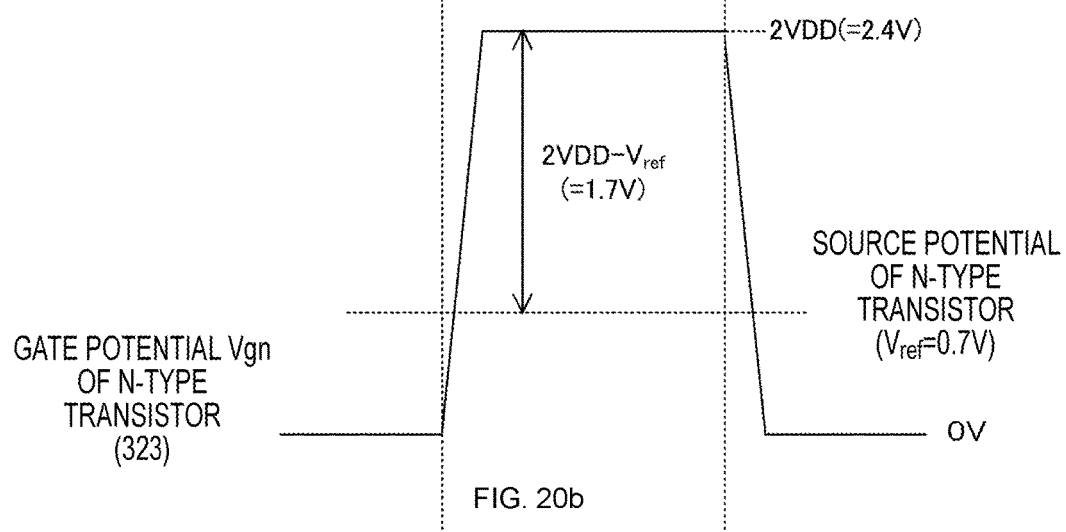
Figure 20C:
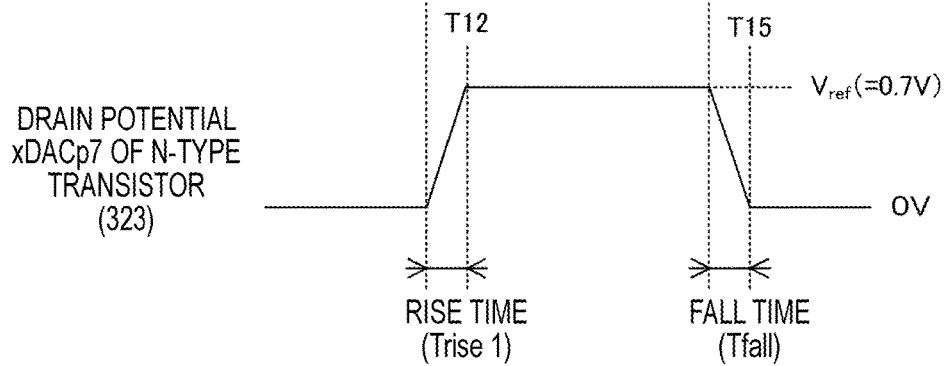

FIGS. 20a, 20b, and 20c are views illustrating an example of fluctuation of the held voltage of the capacitor 316 and a gate potential and a drain potential of the N-type transistor 323 in the fourth embodiment. FIG. 20a illustrates an example of the fluctuation of the held voltage Vc of the capacitor 316. FIG. 20b illustrates the fluctuation in gate potential Vgn of the N-type transistor 323, and c of this drawing illustrates fluctuation in drain potential xDACp7 of the N-type transistor 323.

When a low level is input to the inverter 300 at time T11, a voltage of 2×VDD is held in the capacitor 316 at time T12. Also, at time T12, the gate potential ($V_{gn}$) of the N-type transistor 323 becomes 2×VDD, and the drain potential (xDACp7) thereof becomes $V_{ref}$. Herein, since the source potential of the N-type transistor 323 is $V_{ref}$, a voltage of 2×VDD−$V_{ref}$ (=1.7 V) is applied between the gate and the source. Since this value is higher than the reference voltage $V_{ref}$ (=0.7 V), a delay time of the N-type transistor 323 becomes sufficiently short.

In this manner, according to the fourth embodiment of the present technology, since a voltage higher than an output level ($V_{ref}$) is applied between the gate and the source of the N-type transistor 323, it is possible to sufficiently improve an operation speed without increasing the output level of the N-type transistor 323.

Meanwhile, the above-described embodiments describe an example of embodying the present technology, and there is a correspondence relationship between matters in the embodiments and the matters specifying the invention in claims. Similarly, there is a correspondence relationship between the matters specifying the invention in claims and the matters in the embodiments of the present technology assigned with the same names. However, the present technology is not limited to the embodiments and may be embodied with various modifications of the embodiment without departing from the spirit thereof.

Meanwhile, the effects are not necessarily limited to the effects herein described and may include any of the effects described in the present disclosure.

Meanwhile, the present technology may also have a following configuration.

(1) A voltage conversion circuit provided with:

a high-voltage side transistor which outputs a predetermined high voltage higher than a predetermined reference voltage; and a gate control unit which generates a predetermined control voltage higher than the predetermined high voltage from an input signal and applies the predetermined control voltage between a gate and a source of the high-voltage side transistor to allow the high-voltage side transistor to output the predetermined high voltage.

(2) The voltage conversion circuit according to (1) described above, in which the high-voltage side transistor is a P-type transistor.

(3) The voltage conversion circuit according to (2) described above, in which the gate control unit is provided with:

a capacitor one end of which is connected to the gate of the high-voltage side transistor;

a preceding-stage transistor which supplies the high voltage to the one end of the capacitor on the basis of the input signal; and a first inverter which supplies a voltage higher than the high voltage to the other end of the capacitor on the basis of the input signal.

(4) The voltage conversion circuit according to (3) described above, further provided with:

a reference voltage side transistor which outputs the predetermined reference voltage.

(5) The voltage conversion circuit according to (4) described above, in which the first inverter supplies the voltage higher than the high voltage to the other end of the capacitor on the basis of the input signal and allows the reference voltage side transistor to output the predetermined reference voltage by the voltage.

(6) The voltage conversion circuit according to (4) described above, in which the gate control unit is further provided with a second inverter which allows the reference voltage side transistor to output the predetermined reference voltage on the basis of the input signal.

(7) The voltage conversion circuit according to any one of (1) to (6) described above, in which the high-voltage side transistor is an N-type transistor.

(8) An electronic device provided with:

a voltage conversion circuit provided with a high-voltage side transistor which outputs a predetermined high voltage higher than a predetermined reference voltage, and a gate control unit which generates a predetermined control voltage higher than the predetermined high voltage from an input signal and applies the predetermined control voltage between a gate and a source of the high-voltage side transistor to allow the high-voltage side transistor to output the predetermined high voltage; and a logic circuit which generates the input signal and supplies the input signal to the voltage conversion circuit.

(9) The electronic device according to (8) described above, in which the gate control unit is provided with:

a capacitor one end of which is connected to the gate of the high-voltage side transistor;

a preceding-stage transistor which supplies the high voltage to the one end of the capacitor in a case where the input signal is one of a binary value; and a first inverter which supplies a voltage higher than the high voltage to the other end of the capacitor in a case where the input signal is one of the binary value, in which the logic circuit inverts the input signal at regular intervals in a case where a period during which the input signal is the other of the binary value exceeds a predetermined time.

REFERENCE SIGNS LIST

100 Electronic device
110 Control unit
120 Analog signal generation unit
130 Digital signal processing unit
200 Analog to digital converter
201, 202 Switch
210 Digital to analog converter
221 to 228, 231 to 238, 316 Capacitor
260 Comparator
300 Inverter
301 Buffer
310 Gate control unit
311, 313, 314, 321, 331, 333, 341, 343, 351, 353, 354 P-type transistor
312, 315, 322, 323, 332, 334, 342, 344, 352, 355 N-type transistor
400 Logic circuit
401, 426 Negative AND (NAND) gate
402 to 417, 419 to 425 Flip-flop
418 Logical sum (OR) gate
450 Control signal generation unit
460 Selection unit
470 Time count unit
480 Pulse generation unit

The invention claimed is:

1. A voltage conversion circuit, comprising:
a high-voltage side transistor, wherein
a source of the high-voltage side transistor is configured to connect to a reference voltage, and the high-voltage side transistor is configured to output a first voltage higher than the reference voltage; and
a gate control unit that comprises a capacitor, wherein
a first end of the capacitor is connected to a gate of the high-voltage side transistor, and
the gate control unit is configured to:
generate a control voltage higher than the first voltage based on an input signal; and
apply the generated control voltage between the gate of the high-voltage side transistor and the source of the high-voltage side transistor,
wherein the output of the first voltage is based on the generated control voltage.

2. The voltage conversion circuit according to claim 1, wherein the high-voltage side transistor is a P-type transistor.

3. The voltage conversion circuit according to claim 2, wherein the gate control unit further comprises:
a preceding-stage transistor configured to supply the first voltage to the first end of the capacitor based on the input signal; and
a first inverter configured to supply a second voltage higher than the first voltage to a second end of the capacitor based on the input signal.

4. The voltage conversion circuit according to claim 3, further comprising a reference voltage side transistor, wherein a source of the reference voltage side transistor is configured to connect to a third voltage.

5. The voltage conversion circuit according to claim 4, wherein the reference voltage side transistor is configured to output the reference voltage based on the second voltage.

6. The voltage conversion circuit according to claim 4, wherein
the gate control unit further comprises a second inverter, and
the reference voltage side transistor is configured to output the reference voltage based on the input signal.

7. The voltage conversion circuit according to claim 1, wherein the high-voltage side transistor is an N-type transistor.

8. An electronic device, comprising:
a voltage conversion circuit that comprises:
a high-voltage side transistor, wherein
a source of the high-voltage side transistor is configured to connect to a reference voltage, and
the high-voltage side transistor is configured to output a first voltage higher than the reference voltage; and
a gate control unit that comprises a capacitor, wherein
a first end of the capacitor is connected to a gate of the high-voltage side transistor, and
the gate control unit is configured to:
generate a control voltage higher than the first voltage based on an input signal; and
apply the generated control voltage between the gate of the high-voltage side transistor and the source of the high-voltage side transistor,
wherein the output of the first voltage is based on the generated control voltage; and
a logic circuit configured to:
generate the input signal; and
supply the generated input signal to the voltage conversion circuit.

9. The electronic device according to claim 8, wherein the gate control unit further comprises:
a preceding-stage transistor configured to supply the first voltage to the first end of the capacitor based on the input signal that is a first binary value; and
a first inverter configured to supply a second voltage higher than the first voltage to a second end of the capacitor based on the input signal that is the first binary value, wherein
the logic circuit is further configured to invert the input signal at regular intervals based on a time period in which the input signal is a second binary value,
the second binary value is different from the first binary value, and
the time period exceeds a specific time period.

* * * * *